(12) United States Patent
Ohguro et al.

(10) Patent No.: US 11,038,721 B2
(45) Date of Patent: Jun. 15, 2021

(54) DIGITAL ISOLATOR

(71) Applicants: Kabushiki Kaisha Toshiba, Tokyo (JP); Toshiba Electronic Devices & Storage Corporation, Tokyo (JP)

(72) Inventors: Tatsuya Ohguro, Nonoichi Ishikawa (JP); Tatsuhiro Oda, Yokohama Kanagawa (JP); Kenichi Ootsuka, Nonoichi Ishikawa (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 0 days.

(21) Appl. No.: 16/815,419

(22) Filed: Mar. 11, 2020

(65) Prior Publication Data

US 2021/0083908 A1 Mar. 18, 2021

(30) Foreign Application Priority Data

Sep. 18, 2019 (JP) .............................. JP2019-169302

(51) Int. Cl.
*H04L 25/02* (2006.01)
*H03D 3/00* (2006.01)

(52) U.S. Cl.
CPC .......... *H04L 25/0268* (2013.01); *H03D 3/00* (2013.01); *H04L 25/0272* (2013.01)

(58) Field of Classification Search
CPC ..... H01L 21/823431; H01L 21/823481; H01L 21/845; H01L 23/522; H01L 27/088; H01L 29/51; H04L 25/0268; H04L 25/0272

USPC .................................................. 375/257, 295
See application file for complete search history.

(56) References Cited

U.S. PATENT DOCUMENTS

| 2004/0135189 | A1* | 7/2004 | Kiyotoshi | ........... H01L 27/0688 257/306 |
| 2011/0272813 | A1* | 11/2011 | Kume | ............... H01L 21/76814 257/758 |
| 2015/0257316 | A1* | 9/2015 | Lin | ..................... H05K 13/0486 156/150 |
| 2019/0074211 | A1* | 3/2019 | Min | .................. H01L 21/76232 |
| 2019/0088553 | A1* | 3/2019 | Van Dal | ............. H01L 27/0688 |

(Continued)

FOREIGN PATENT DOCUMENTS

| JP | H04-236423 A | 8/1992 |
| JP | 2005-136097 A | 5/2005 |
| JP | 2013-229503 A | 11/2013 |

*Primary Examiner* — Emmanuel Bayard
(74) *Attorney, Agent, or Firm* — White & Case LLP

(57) ABSTRACT

According to one embodiment, a digital isolator includes a first metal portion, a first insulating portion, a second metal portion, a third metal portion, and a first layer. The first insulating portion is provided on the first metal portion. The second metal portion is provided on the first insulating portion. The third metal portion includes first, second, and third portions. The first portion is provided around the first metal portion in a direction perpendicular to a first direction. The second portion is provided on a portion of the first portion with a first conductive layer interposed. The third portion is provided on the second portion and provided around the second metal portion in the perpendicular direction. The first layer contacts the first conductive layer and another portion of the first portion and is provided around a bottom portion of the second portion.

17 Claims, 23 Drawing Sheets

(56) References Cited

U.S. PATENT DOCUMENTS

2019/0280087 A1* 9/2019 Park ................. H01L 29/66545
2020/0006331 A1* 1/2020 Lilak ................ H01L 29/66795

* cited by examiner

DIGITAL ISOLATOR

CROSS-REFERENCE TO RELATED APPLICATIONS

This application is based upon and claims the benefit of priority from Japanese Patent Application No. 2019-169302, filed on Sep. 18, 2019; the entire contents of which are incorporated herein by reference.

FIELD

Embodiments described herein relate generally to a digital isolator.

BACKGROUND

A digital isolator transmits a signal by utilizing the change of a magnetic field or an electric field in a state in which the current is blocked. It is desirable to increase the reliability of the digital isolator.

DETAILED DESCRIPTION

Figure 1:
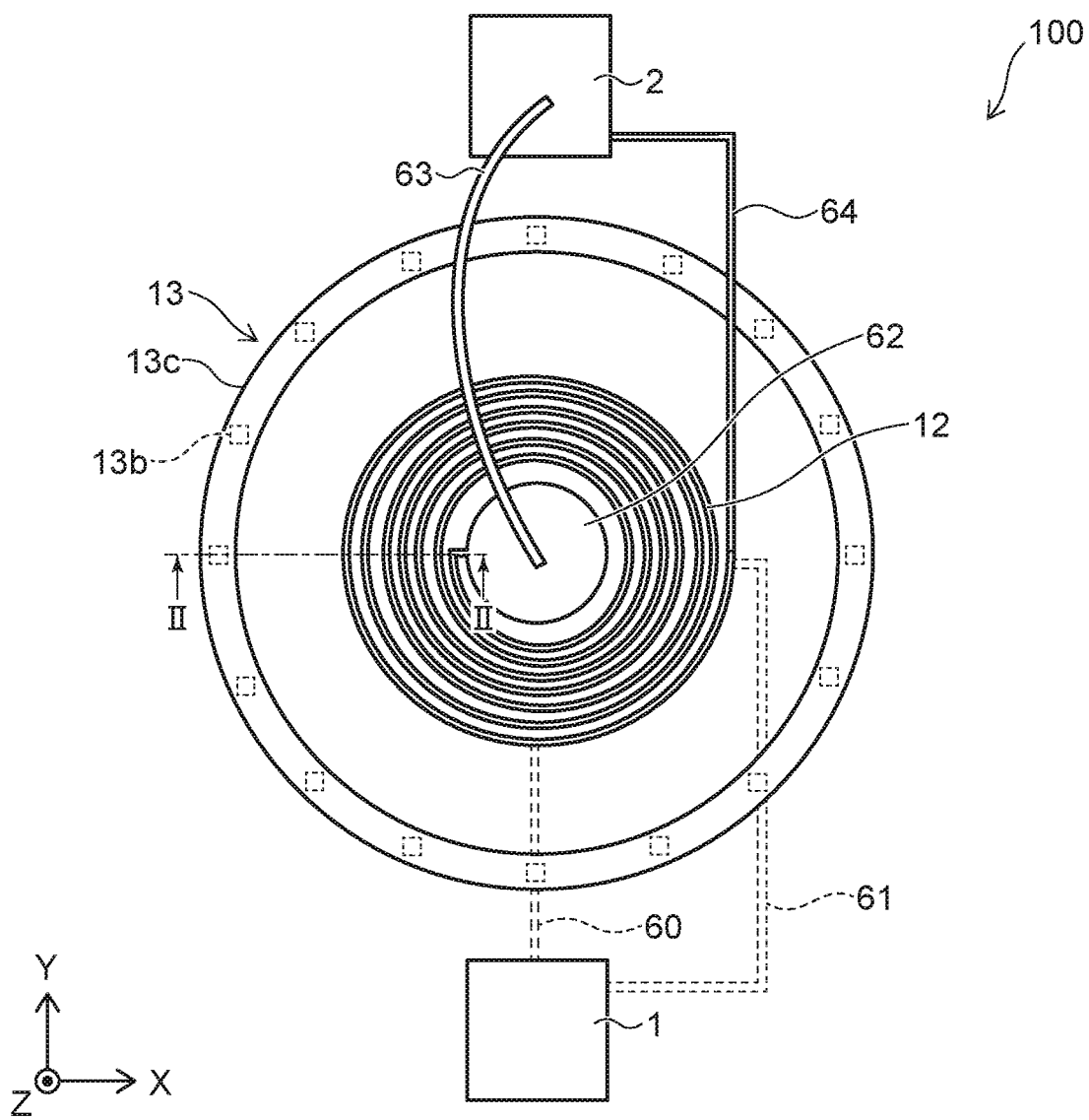
FIG. 1 is a plan view illustrating a digital isolator according to an embodiment.

According to one embodiment, a digital isolator includes a first metal portion, a first insulating portion, a second metal portion, a third metal portion, and a first layer. The first insulating portion is provided on the first metal portion. The second metal portion is provided on the first insulating portion. The third metal portion includes a first portion, a second portion, and a third portion. The first portion is provided around the first metal portion in a direction perpendicular to a first direction. The first direction is from the first metal portion toward the second metal portion. The second portion is provided on a portion of the first portion with a first conductive layer interposed. The first conductive layer includes tantalum. The third portion is provided on the second portion and provided around the second metal portion in the perpendicular direction. The first layer contacts the first conductive layer and an other portion of the first portion and is provided around a bottom portion of the second portion. The first layer includes titanium or includes silicon and carbon.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

FIG. 1 is a plan view illustrating a digital isolator according to an embodiment.

Figure 2:
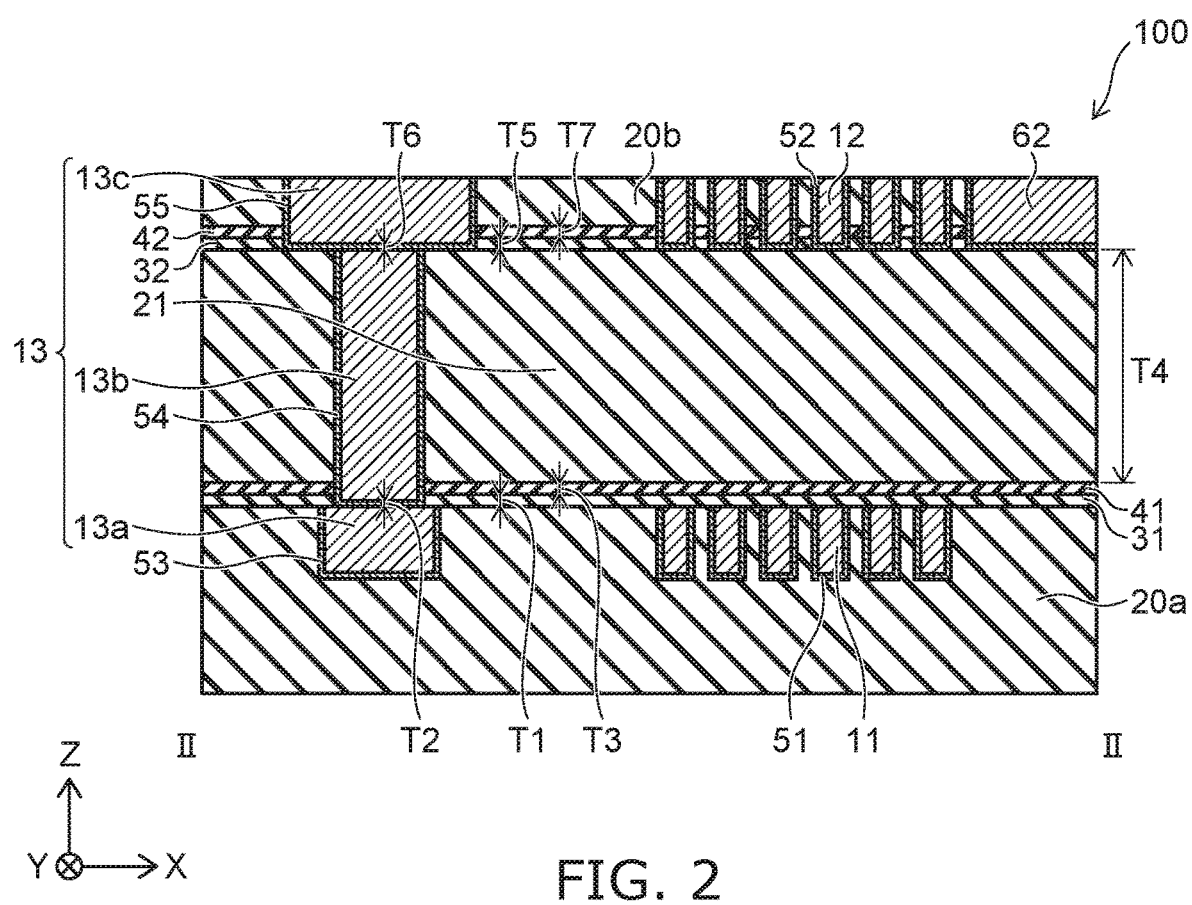
FIG. 2 is a II-II cross-sectional view of FIG. 1.

FIG. 2 is a II-II cross-sectional view of FIG. 1.

As illustrated in FIG. 1 and FIG. 2, the digital isolator 100 according to the embodiment includes a first circuit 1, a second circuit 2, a first metal portion 11, a second metal portion 12, a third metal portion 13, a first insulating portion 21, a first layer 31, a second layer 32, a first insulating layer 41, a second insulating layer 42, and conductive layers 51 to 55.

In the digital isolator 100 according to the embodiment, a signal is transmitted in a state in which a current is blocked (insulated) between the first metal portion 11 and the second metal portion 12.

An XYZ orthogonal coordinate system is used in the description of the embodiments. The direction from the first metal portion 11 toward the second metal portion 12 is taken as a Z-direction (a first direction). Two mutually-orthogonal directions perpendicular to the Z-direction are taken as an X-direction (a second direction) and a Y-direction (a third direction). For the description, the direction from the first metal portion 11 toward the second metal portion 12 is called "up;" and the reverse direction is called "down." These directions are based on the relative positional relationship between the first metal portion 11 and the second metal portion 12 and are independent of the direction of gravity.

As illustrated in FIG. 2, for example, the first metal portion 11 is provided inside an insulating portion 20a. The conductive layer 51 is provided between the first metal portion 11 and the insulating portion 20a. The first insulating portion 21 is provided on the first metal portion 11 and the insulating portion 20a. The second metal portion 12 is provided on the first insulating portion 21. For example, the second metal portion 12 is provided inside an insulating portion 20b. The conductive layer 52 is provided between the second metal portion 12 and the insulating portion 20b.

In the example illustrated in FIG. 1 and FIG. 2, the first metal portion 11 and the second metal portion 12 are coils provided in spiral configurations along the X-Y plane. The first metal portion 11 and the second metal portion 12 oppose each other in the Z-direction. In other words, in FIG. 1 when viewed from the Z-direction, the second metal portion 12 is provided to overlap the first metal portion 11.

As illustrated in FIG. 1, one end of the first metal portion 11 (one end of the coil) is electrically connected to the first circuit 1 via wiring 60. An electrode pad 62 is connected to one end of the second metal portion 12 (one end of the coil). For example, the electrode pad 62 is provided at the inner region of the second metal portion 12. The electrode pad 62 may be formed as an integral body with the second metal portion 12. For example, the second circuit 2 and the electrode pad 62 are electrically connected via a bonding wire 63.

The third metal portion 13 surrounds the first metal portion 11 and the second metal portion 12 in the X-direction and the Y-direction. Specifically, as illustrated in FIG. 2, the third metal portion 13 includes a first portion 13a, a second portion 13b, and a third portion 13c.

The first portion 13a is provided around the first metal portion 11 in the X-direction and the Y-direction. For example, the first portion 13a is provided inside the insulating portion 20a. The conductive layer 53 is provided between the first portion 13a and the insulating portion 20a. The other end of the first metal portion 11 (the other end of the coil) is electrically connected to the first circuit 1 by wiring 61.

The second portion 13b is provided on a portion of the first portion 13a. The first insulating portion 21 is provided on another portion of the first portion 13a. The conductive layer 54 (a first conductive layer) is provided between the second portion 13b and the first portion 13a and between the second portion 13b and the first insulating portion 21.

The third portion 13c is provided around the second metal portion 12 in the X-direction and the Y-direction. For example, the third portion 13c is provided inside the insulating portion 20b. The conductive layer 55 (a second conductive layer) is provided between the third portion 13c and the insulating portion 20b. The other end of the second metal portion 12 is electrically connected to the second circuit 2 by wiring 64.

For example, as illustrated in FIG. 1, the first portion 13a and the third portion 13c have ring configurations when viewed from the Z-direction. Multiple second portions 13b are provided along the ring-shaped first portion 13a and the ring-shaped third portion 13c.

As illustrated in FIG. 2, the first layer 31 is provided around the bottom portion of the second portion 13b. The first layer 31 contacts the conductive layer 54 and the other portion of the first portion 13a recited above. Therefore, the first insulating portion 21 does not contact the first portion 13a and is separated from the first portion 13a in the Z-direction.

The first insulating layer 41 is provided between the first metal portion 11 and the first insulating portion 21. The first insulating layer 41 may contact the first metal portion 11 or may be separated from the first metal portion 11 in the Z-direction.

The second layer 32 is provided on the first insulating portion 21. The second layer 32 is provided around the bottom portion of the third portion 13c and around the bottom portion of the second metal portion 12 and contacts the conductive layers 52 and 55. The second insulating layer 42 is provided on the second layer 32 and contacts the conductive layers 52 and 55.

In the digital isolator 100, the first layer 31 is insulative. The first layer 31 is provided also between the first metal portion 11 and the first insulating layer 41 and contacts the first metal portion 11. The first insulating layer 41 is positioned between the first layer 31 and the first insulating portion 21. The first insulating layer 41 is provided also between the first insulating portion 21 and the other portion of the first portion 13a recited above and contacts the conductive layer 54.

One of the first circuit 1 or the second circuit 2 is used as a receiving circuit. The other of the first circuit 1 or the second circuit 2 is used as a transmitting circuit. Here, a case will be described where the first circuit 1 is the receiving circuit and the second circuit 2 is the transmitting circuit.

The second circuit 2 transmits, to the first metal portion 11, a signal (a current) having a waveform suited to transmission. When the current flows through the first metal portion 11, a magnetic field that passes through the center of the spiral-shaped first metal portion 11 is generated. The center position in the X-Y plane of the first metal portion 11 is substantially the same as the center position in the X-Y plane of the second metal portion 12. Therefore, when the magnetic field is generated at the first metal portion 11, a portion of the magnetic force lines passes through the inner region of the second metal portion 12. An induced electromotive force is generated in the second metal portion 12 by the change of the magnetic field at the inner region of the second metal portion 12; and a current flows through the second metal portion 12. The first circuit 1 detects the current flowing through the second metal portion 12 and generates a signal corresponding to the detection result. Thereby, the signal is transmitted in the state in which the current is blocked (insulated) between the first metal portion 11 and the second metal portion 12.

The third metal portion 13 is connected to a reference potential. The reference potential is, for example, the ground potential. Because the third metal portion 13, which is connected to the reference potential, is provided around the first metal portion 11 and the second metal portion 12, leakage of the magnetic field outside the digital isolator 100 can be suppressed.

Examples of the materials of the components of the digital isolator 100 will now be described.

The first metal portion 11, the second metal portion 12, and the third metal portion 13 include metals. To suppress the heat generation of the first metal portion 11 and the second metal portion 12 when transmitting the signal, it is favorable for the electrical resistances of these metal portions to be low. From the perspective of reducing the electrical resistances, it is favorable for the first metal portion 11 and the second metal portion 12 to include copper.

The first insulating portion 21, the insulating portion 20a, and the insulating portion 20b include, for example, an insulating material including oxygen and silicon. The first insulating portion 21, the insulating portion 20a, and the insulating portion 20b include, for example, an insulating material such as silicon oxide, etc. The insulating portion 20a may be at least a portion of a substrate.

The conductive layers 51 to 55 include tantalum. The conductive layers 51 to 55 may include a nitride of tantalum. The conductive layers 51 to 55 may have a stacked structure of tantalum and a nitride of tantalum. The conductive layers 51 to 55 suppress the diffusion into the first insulating portion 21, the insulating portion 20a, and the insulating portion 20b of the metals included in the first to third metal portions 11 to 13.

The first layer 31 and the second layer 32 include carbon, silicon, and at least one selected from the group consisting of oxygen and nitrogen. For example, the first layer 31 and the second layer 32 include SiCO, SiCN, or SiCON. The material that is included in the second layer 32 may be different from the material included in the first layer 31.

The first insulating layer 41 and the second insulating layer 42 include silicon nitride.

The carbon concentration in the first layer 31 is higher than the carbon concentration in the first insulating layer 41. The hardness can be reduced by adding more carbon to the insulating layers. Therefore, the Young's modulus of the first layer 31 is lower than the Young's modulus of the first insulating layer 41. Similarly, the carbon concentration in the second layer 32 is higher than the carbon concentration in the second insulating layer 42 and higher than the carbon concentration in the first insulating layer 41. Therefore, the Young's modulus of the second layer 32 is lower than the Young's modulus of the second insulating layer 42 and lower than the Young's modulus of the first insulating layer 41. The carbon concentration in the first layer 31 may be the same as or different from the carbon concentration in the second layer 32. On the other hand, to improve the insulative properties, it is favorable for the first insulating layer 41 and the second insulating layer 42 to be formed without adding carbon.

For example, the carbon concentration in the first layer 31 and the carbon concentration in the second layer 32 each are not less than 15 atom % and not more than 25 atom % in atomic composition percent. The carbon concentration in the first insulating layer 41 and the carbon concentration in the second insulating layer 42 each are not less than 0 atom % and not more than 10 atom % in atomic composition percent.

For example, a thickness T1 in the Z-direction of the first layer 31 is greater than a thickness T2 in the Z-direction of the conductive layer 54. The thickness T2 is measured based on a portion of the conductive layer 54 positioned between the first portion 13a and the second portion 13b in the Z-direction. For example, a thickness T3 of the first insulating layer 41 is greater than the thickness T2. The thickness T1 and the thickness T3 each are smaller than a thickness T4 of the first insulating portion 21.

For example, a thickness T5 in the Z-direction of the second layer 32 is thicker than a thickness T6 in the Z-direction of the conductive layer 55. The thickness T6 is measured based on a portion of the conductive layer 55 positioned between the second portion 13b and the third portion 13c in the Z-direction. For example, a thickness T7 of the second insulating layer 42 is thicker than the thickness T6. The thickness T5 and the thickness T7 each are smaller than the thickness T4 of the first insulating portion 21.

An example of a method for manufacturing the digital isolator according to the embodiment will now be described.

FIG. 3A to FIG. 5 are process cross-sectional views illustrating manufacturing processes of the digital isolator according to the embodiment.

Figure 3A:
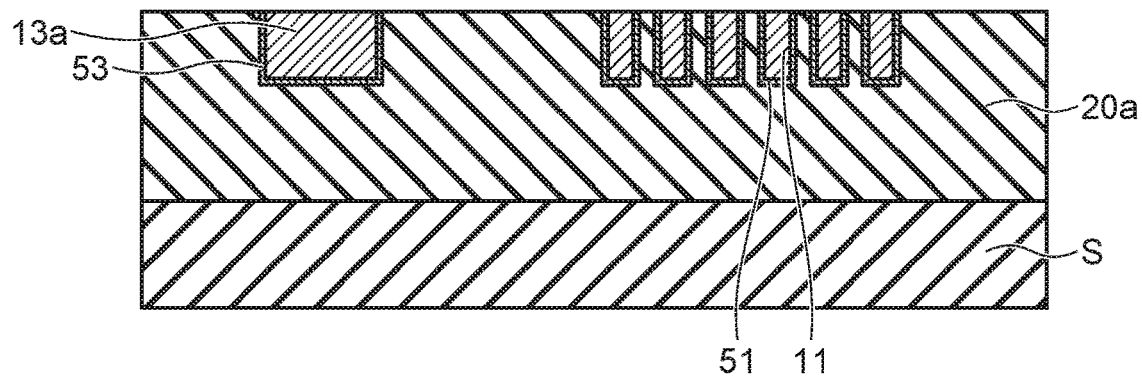
FIGS. 3A and 3B are process cross-sectional views illustrating manufacturing processes of the digital isolator according to the embodiment.

First, an insulative substrate S is prepared. For example, a silicon substrate can be used as the substrate S. The first circuit 1 is formed in the substrate S. The insulating portion 20a is formed on the substrate S. An opening is formed in the insulating portion 20a by reactive ion etching (RIE). The opening includes a spiral-shaped portion, and a ring-shaped portion surrounding the spiral-shaped portion. A conductive layer is formed along the inner surface of the opening and the upper surface of the insulating portion 20a by sputtering. A metal layer that fills the opening is formed on the conductive layer by sputtering and electroplating. The upper surface of the metal layer and the upper surface of the conductive layer are caused to recede by chemical mechanical polishing (CMP) until the upper surface of the insulating portion 20a is exposed. As illustrated in FIG. 3A, the first metal portion 11, the conductive layer 51, the first portion 13a, and the conductive layer 53 are formed thereby.

Figure 3B:
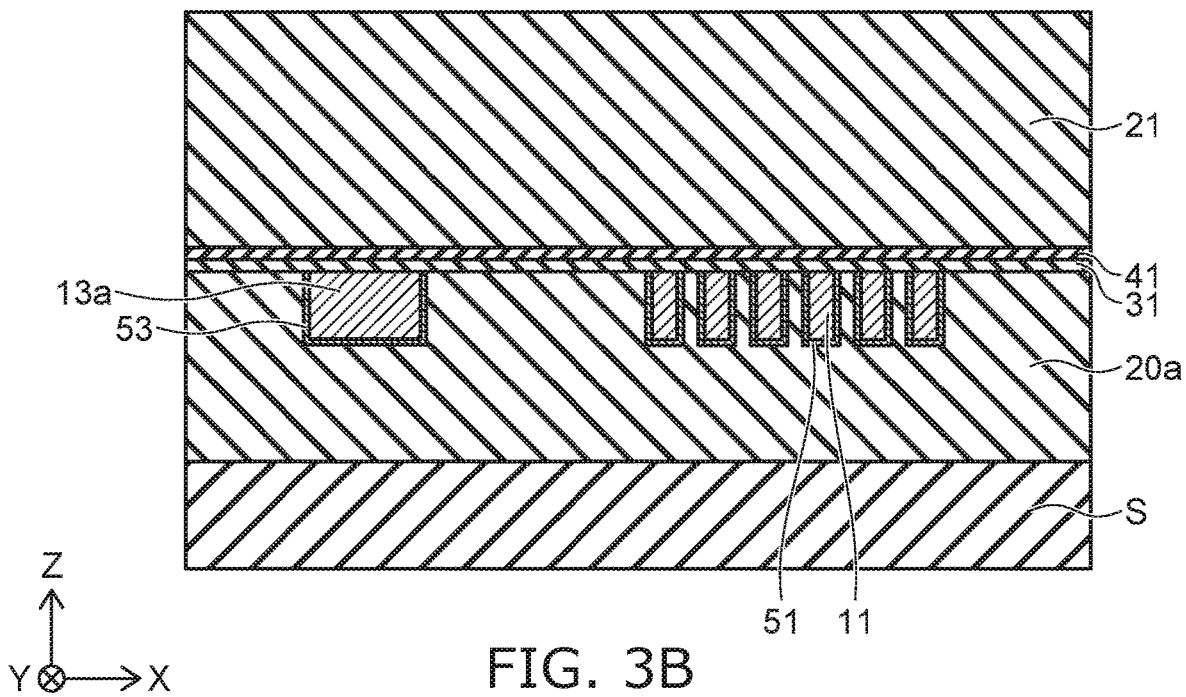

The first layer 31 that covers the first metal portion 11 and the first portion 13a is formed on the insulating portion 20a by chemical vapor deposition (CVD). For example, a gas that includes carbon and silicon such as trimethylsilane or the like, a nitrogen-including gas such as ammonia ($NH_3$) or the like, and an inert gas are supplied onto the insulating portion 20a. The first layer 31 that includes SiCN is formed thereby. The first insulating layer 41 that includes silicon nitride is formed on the first layer 31 by CVD. As illustrated in FIG. 3B, the first insulating portion 21 is formed on the first insulating layer 41 by CVD.

An opening is formed above the first portion 13a by removing a portion of the first insulating portion 21 by RIE. At this time, the first insulating layer 41 functions as a stopper. A portion of the exposed first insulating layer 41 and a portion of the first layer 31 are removed via the opening by wet etching or RIE. In the case where wet etching is performed, a mixed liquid of ammonium fluoride ($NH_4F$), hydrogen fluoride (HF), and water ($H_2O$), a mixed liquid of hydrogen fluoride (HF) and water ($H_2O$), or phosphoric acid ($H_3PO_4$) can be used as the etchant. In the case where RIE is performed, a gas that includes a fluorinated saturated hydrocarbon such as $CHF_3$, $CH_2F_2$, $C_4H_9F$, or the like is used as the etching gas.

Figure 4A:
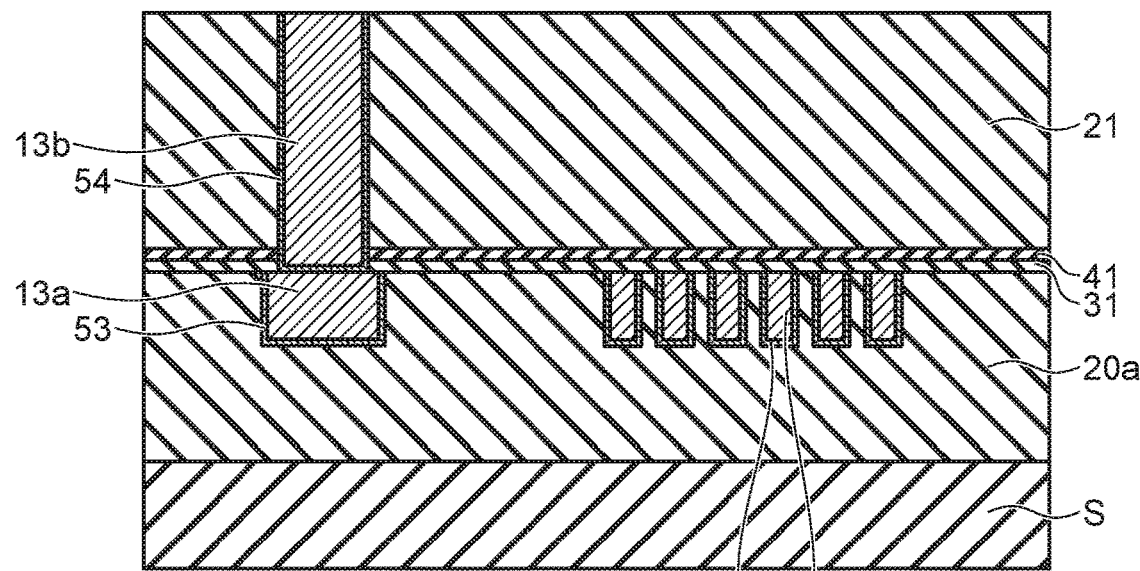
FIGS. 4A and 4B are process cross-sectional views illustrating manufacturing processes of the digital isolator according to the embodiment.

A portion of the upper surface of the first portion 13a is exposed via the opening. A conductive layer is formed along the inner surface of the opening and the upper surface of the first insulating portion 21 by sputtering. A metal layer that fills the opening is formed on the conductive layer by sputtering and electroplating. The upper surface of the metal layer and the upper surface of the conductive layer are caused to recede by CMP until the upper surface of the first insulating portion 21 is exposed. As illustrated in FIG. 4A, the second portion 13b and the conductive layer 54 are formed thereby.

Figure 4B:
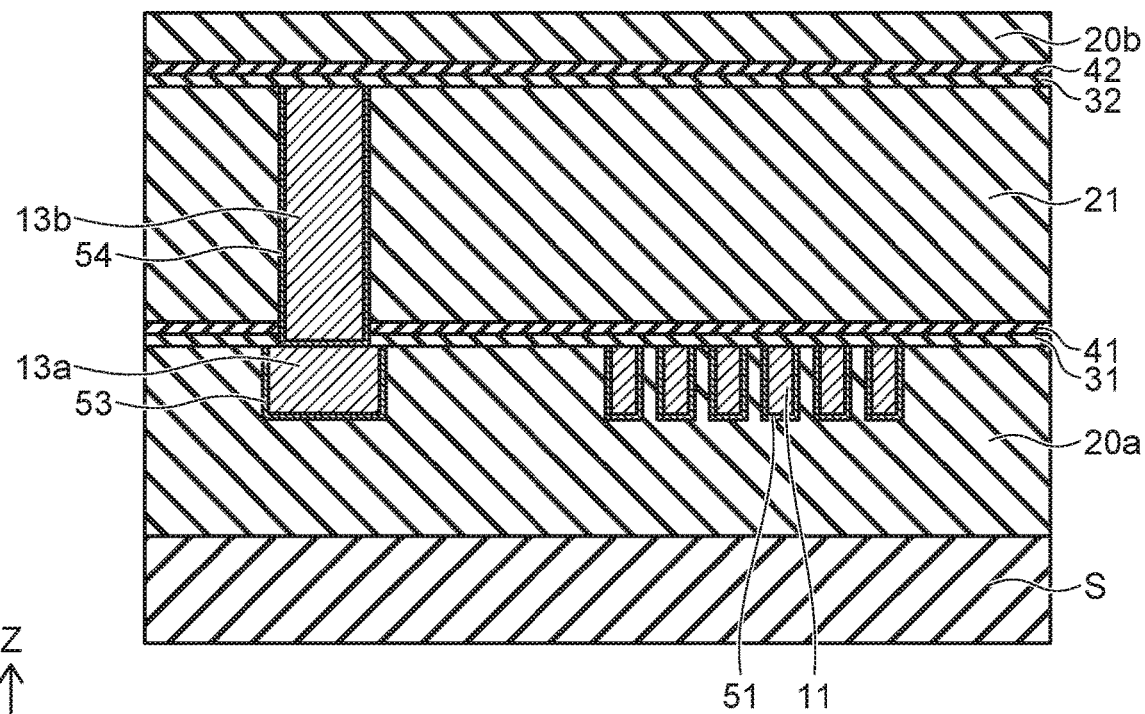

Similarly to the first layer 31, the second layer 32 is formed on the second portion 13b and the first insulating portion 21 by CVD. The second insulating layer 42 is formed on the second layer 32 by CVD. As illustrated in FIG. 4B, the insulating portion 20b is formed on the second insulating layer 42 by CVD.

An opening is formed above the first metal portion 11 and the second portion 13b by removing a portion of the insulating portion 20b by RIE. The opening includes a spiral-shaped portion, and a ring-shaped portion surrounding the spiral-shaped portion. When forming the opening, the second insulating layer 42 functions as a stopper. A portion of the exposed second insulating layer 42 and a portion of the second layer 32 are removed via the opening by wet etching or RIE. The chemical liquid or the gas for removing the first layer 31 and the first insulating layer 41 described above can be used as the etchant or the etching gas.

Figure 5:
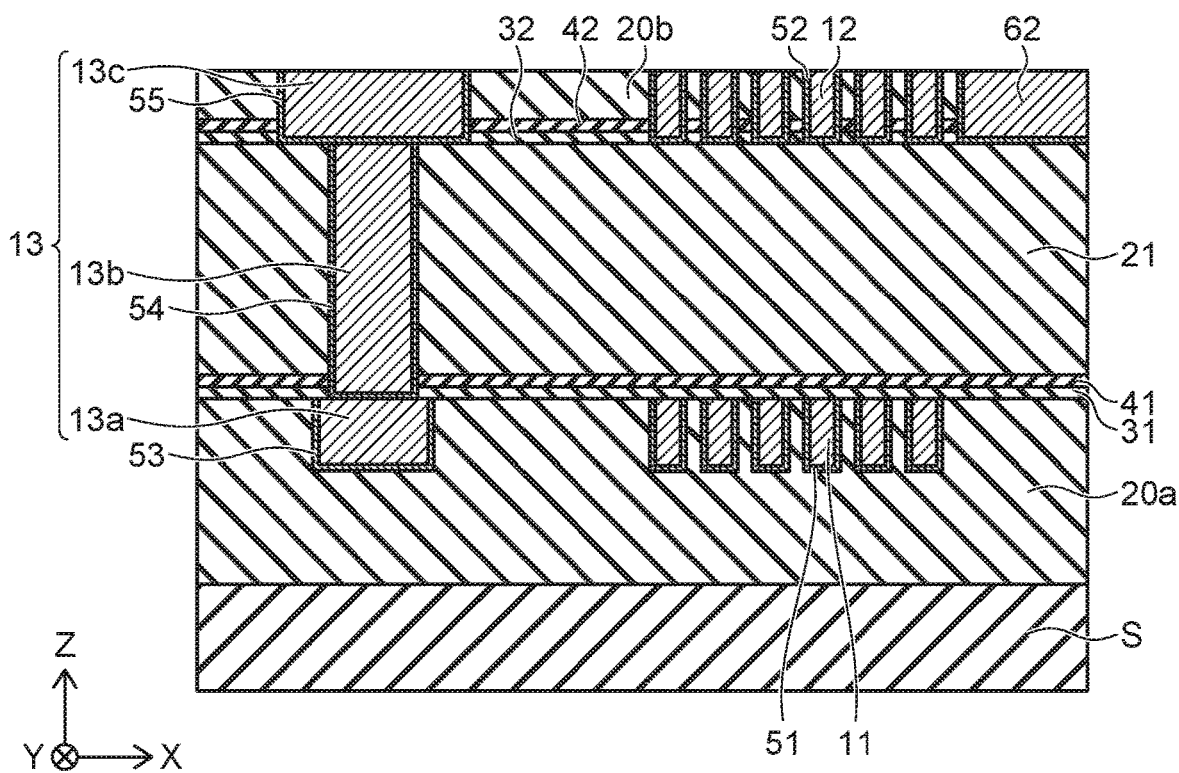
FIG. 5 is a process cross-sectional view illustrating manufacturing processes of the digital isolator according to the embodiment.

A conductive layer is formed along the inner surface of the opening and the upper surface of the insulating portion 20b by sputtering. A metal layer that fills the opening is formed on the conductive layer by sputtering and electroplating. The upper surface of the metal layer and the upper surface of the conductive layer are caused to recede by CMP until the upper surface of the insulating portion 20b is exposed. As illustrated in FIG. 5, the second metal portion 12, the electrode pad 62, the conductive layer 52, the third portion 13c, and the conductive layer 55 are formed thereby. By the processes recited above, the digital isolator 100 illustrated in FIG. 1 and FIG. 2 is manufactured.

A protective film may be formed on the second metal portion 12, the electrode pad 62, the conductive layer 52, the third portion 13c, and the conductive layer 55. In such a case, an opening is provided by removing the protective film on the electrode pad 62. An insulating film may be formed on the second metal portion 12, the conductive layer 52, the third portion 13c, and the conductive layer 55; and a wiring layer that includes an electrode pad may be formed on the insulating film.

Effects of the embodiment will now be described with reference to FIG. 6.

Figure 6:
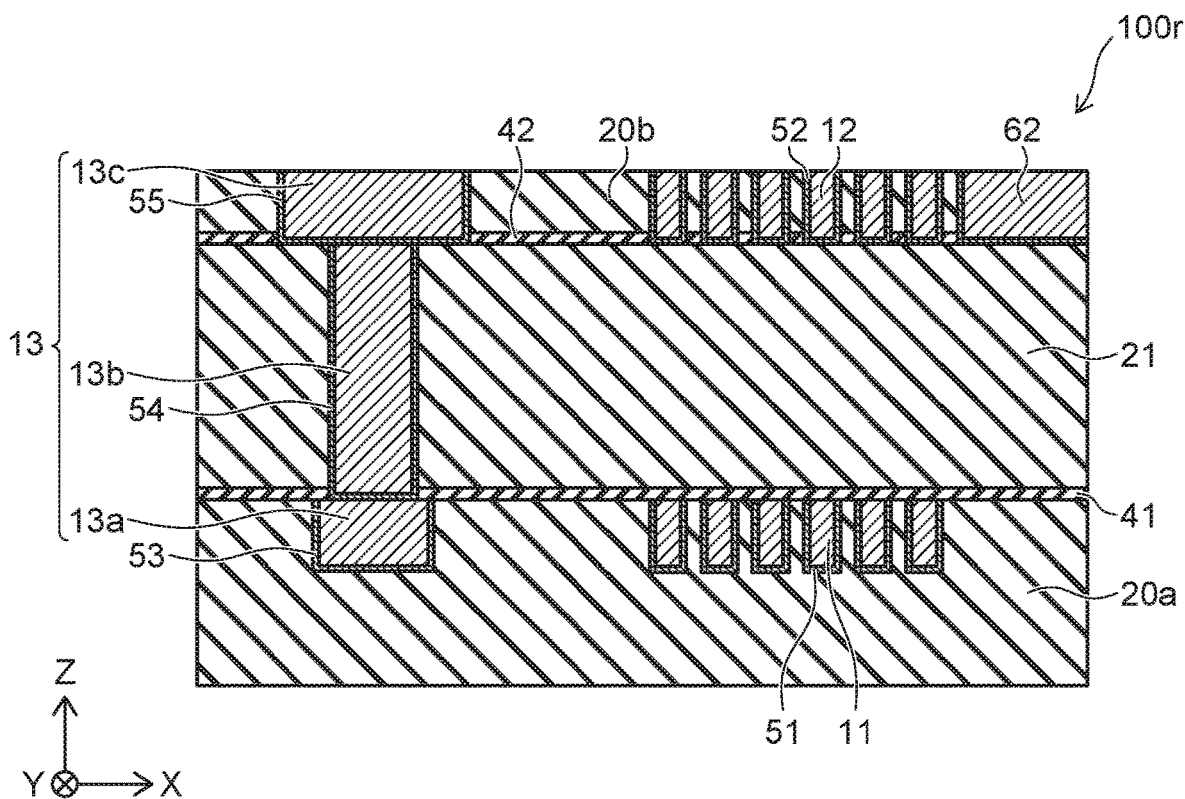
FIG. 6 is a cross-sectional view illustrating a digital isolator according to a reference example.

FIG. 6 is a cross-sectional view illustrating a digital isolator according to a reference example.

The first layer 31 and the second layer 32 are not provided in the digital isolator 100r according to the reference example illustrated in FIG. 6. The first insulating layer 41 is provided around the bottom portion of the second portion 13b. The first insulating layer 41 contacts the first portion 13a and the conductive layer 54. The second insulating layer 42 is provided around the bottom portion of the third portion 13c. The second insulating layer 42 contacts the first insulating portion 21 and the conductive layer 55.

The first insulating layer 41 includes silicon nitride. By contacting the first portion 13a, the first insulating layer 41 can suppress the diffusion from the first portion 13a of the metal atoms included in the first portion 13a into the first insulating portion 21 and the insulating portion 20a. Thereby, the leakage current due to the diffusion of the metal atoms can be reduced; and the reliability of the digital isolator 100r can be increased.

On the other hand, the conductive layer 54 which includes tantalum has high compressive stress. The conductive layer 54 is provided along the X-Y plane at the bottom portion of the second portion 13b. Therefore, at the bottom portion of the second portion 13b, the conductive layer 54 applies stress to the other members along the X-Y plane. Also, thermal expansion of the third metal portion 13 occurs when heat is generated as the digital isolator 100 is used. Therefore, in the digital isolator 100r, a large stress is applied from the first portion 13a of the third metal portion 13 and the conductive layer 54 to the first insulating layer 41. The first insulating layer 41 has a dense structure and a high Young's modulus. When the large stress is applied to the first insulating layer 41, there is a possibility that the stress may not be dispersed sufficiently; and the first insulating layer 41 may peel.

In the digital isolator 100 according to the embodiment, the first layer 31 is provided around the bottom portion of the second portion 13b. By contacting the first portion 13a around the bottom portion of the second portion 13b, the first layer 31 can suppress the diffusion of the metal atoms included in the first portion 13a. Also, the carbon concentration in the first layer 31 is higher than the carbon concentration in the first insulating layer 41. Therefore, the Young's modulus of the first layer 31 is lower than the Young's modulus of the first insulating layer 41. Even when stress is applied from the first portion 13a and the conductive layer 54, the first layer 31 deforms easily and does not peel easily compared to the first insulating layer 41. By providing the first layer 31, the peeling of the first insulating layer 41 can be suppressed; and the reliability of the digital isolator 100 can be increased.

Similarly, in the digital isolator 100r according to the reference example, the second insulating layer 42 is subjected to stress from the conductive layer 55 around the bottom portion of the third portion 13c. Thereby, there is a possibility that peeling of the second insulating layer 42 may occur. In the digital isolator 100 according to the embodiment, the second layer 32 is provided around the bottom portion of the third portion 13c. The carbon concentration in the second layer 32 is higher than the carbon concentration in the second insulating layer 42. Therefore, the Young's modulus of the second layer 32 is lower than the Young's modulus of the second insulating layer 42. By providing the second layer 32, even when the stress is applied from the conductive layer 55, the peeling of the second insulating layer 42 can be suppressed; and the reliability of the digital isolator 100 can be increased.

Compared to the first layer 31, the first insulating layer 41 has a dense structure in which the added amount of carbon is low. Therefore, the electrical resistance of the first insulating layer 41 is higher than the electrical resistance of the first layer 31. By providing the first insulating layer 41 between the first metal portion 11 and the first insulating portion 21, the electrical resistance between the first metal portion 11 and the second metal portion 12 can be increased; and the leakage current between these metal portions can be reduced.

In the digital isolator 100, the first layer 31 is provided also between the first metal portion 11 and the first insulating layer 41; and the first insulating layer 41 is provided also between the first portion 13a and the first insulating portion 21. According to this structure, patterning of the first layer 31 and the first insulating layer 41 is unnecessary when forming the first layer 31 and the first insulating layer 41. Therefore, the number of processes necessary for manufacturing the digital isolator 100 can be reduced.

The first insulating layer 41 is provided between the first metal portion 11 and the second metal portion 12 even in the case where the first layer 31, which has a lower electrical resistance than the first insulating layer 41, is provided between the first metal portion 11 and the second metal portion 12. Thereby, the electrical resistance between the first metal portion 11 and the second metal portion 12 can be increased; and the leakage current between these metal portions can be reduced.

A portion of the conductive layer 54 extends in the Z-direction between the second portion 13b and the first insulating portion 21. The first insulating layer 41 contacts the portion of the conductive layer 54. Because the portion of the conductive layer 54 extends in the Z-direction, the stress that acts toward the X-direction and the Y-direction is not large. The stress that is applied from the conductive layer 54 to the first insulating layer 41 is smaller than the stress applied from the conductive layer 54 to the first layer 31. Therefore, as long as the first layer 31 is provided, the first insulating layer 41 may contact the conductive layer 54.

Similarly, a portion of the conductive layer 55 extends in the Z-direction between the third portion 13c and the insulating portion 20b; and the second insulating layer 42 contacts the portion of the conductive layer 55. However, the stress that is applied from the conductive layer 55 to the second insulating layer 42 is smaller than the stress applied from the conductive layer 55 to the second layer 32, Therefore, as long as the second layer 32 is provided, the second insulating layer 42 may contact the conductive layer 55.

First Modification

Figure 7:
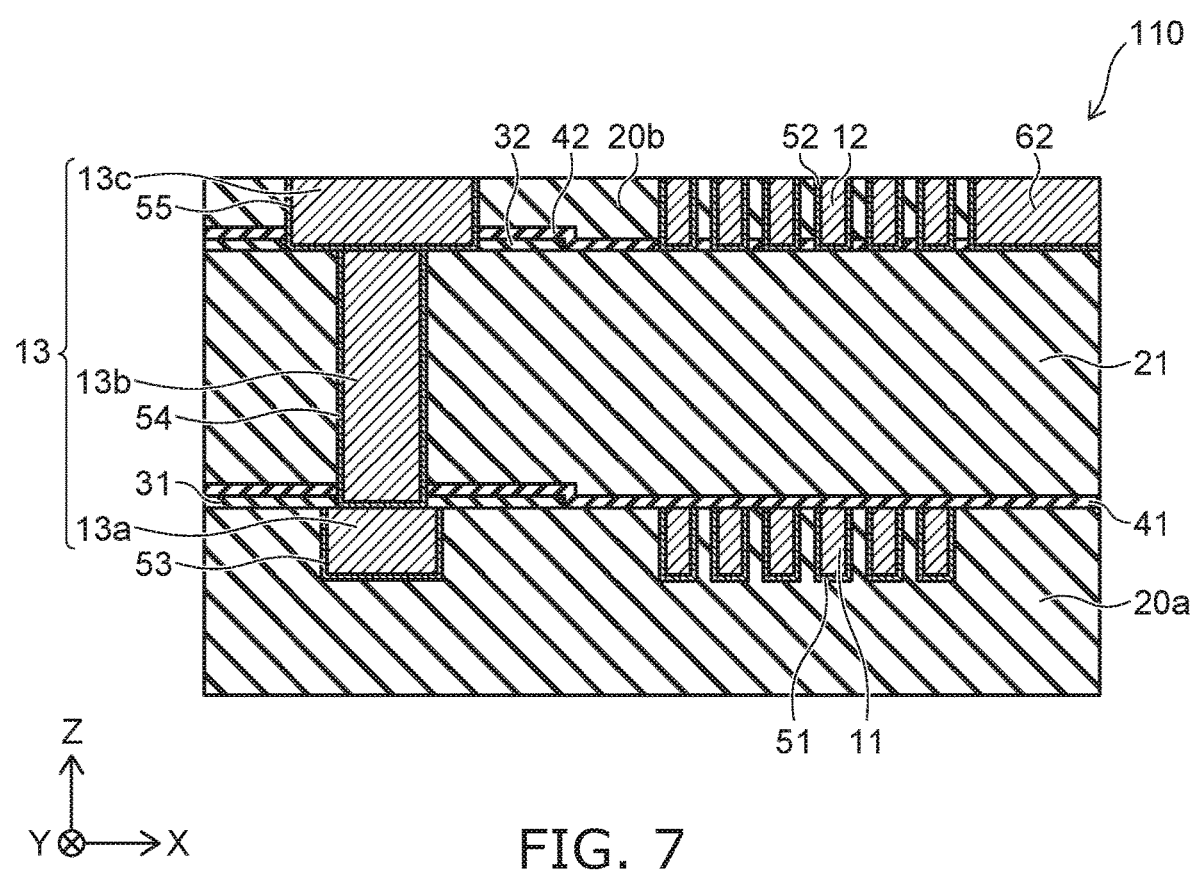
FIG. 7 is a cross-sectional view illustrating a portion of a digital isolator according to a first modification of the embodiment.

FIG. 7 is a cross-sectional view illustrating a portion of a digital isolator according to a first modification of the embodiment.

In the digital isolator 110 according to the first modification, the first layer 31 is provided only around the bottom portion of the second portion 13b. In other words, the first layer 31 is not provided between the first metal portion 11 and the second metal portion 12. A portion of the first insulating layer 41 is provided between the first metal portion 11 and the first insulating portion 21; and another portion of the first insulating layer 41 is provided between the first layer 31 and the first insulating portion 21.

Similarly, the second layer 32 is provided only around the bottom portion of the third portion 13c. The second layer 32 is not provided around the bottom portion of the second metal portion 12 and is separated from the second metal portion 12. A portion of the second insulating layer 42 is provided around the bottom portion of the second metal portion 12; and another portion of the second insulating layer 42 is provided on the second layer 32.

Figure 8A:
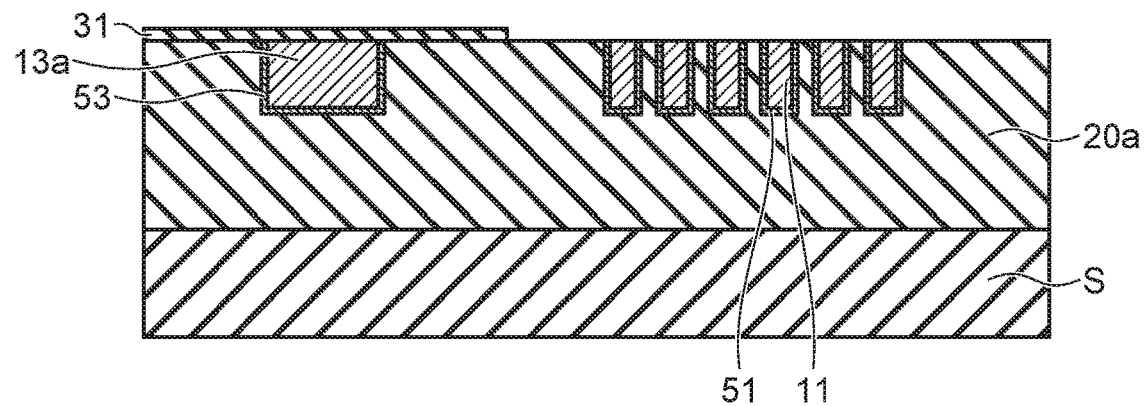
FIGS. 8A and 8B are process cross-sectional views illustrating manufacturing processes of the digital isolator according to the first modification of the embodiment.
Figure 8B:
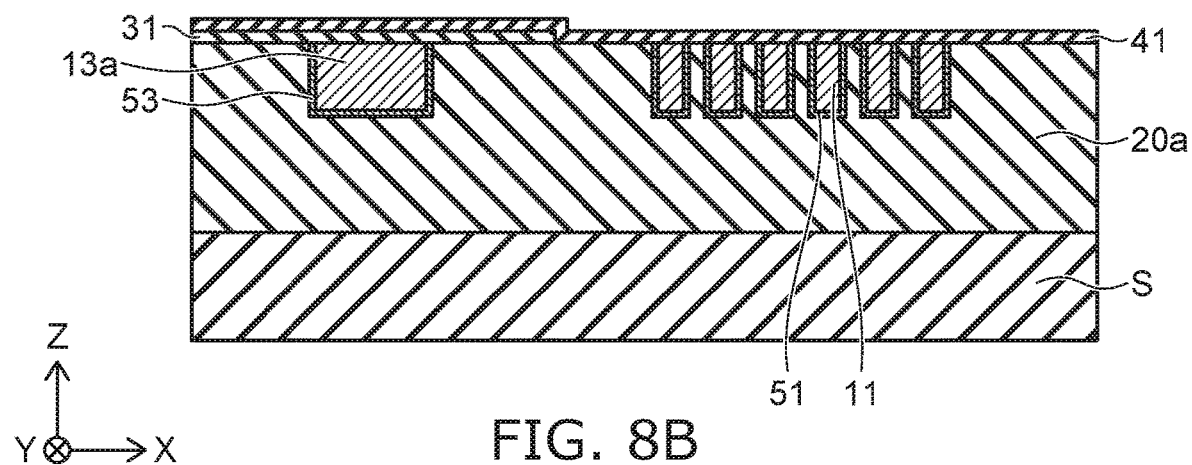

FIGS. 8A and 8B are process cross-sectional views illustrating manufacturing processes of the digital isolator according to the first modification of the embodiment.

First, the first metal portion 11, the conductive layer 51, the first portion 13a, and the conductive layer 53 are formed by performing processes similar to the processes illustrated in FIG. 3A. The first layer 31 that covers the first metal portion 11 and the first portion 13a is formed by CVD. As illustrated in FIG. 8A, a portion of the first layer 31 is removed by RIE to expose the first metal portion 11. As illustrated in FIG. 8B, the first insulating layer 41 is formed on the first metal portion 11 and the first layer 31 by CVD.

Figure 9A:
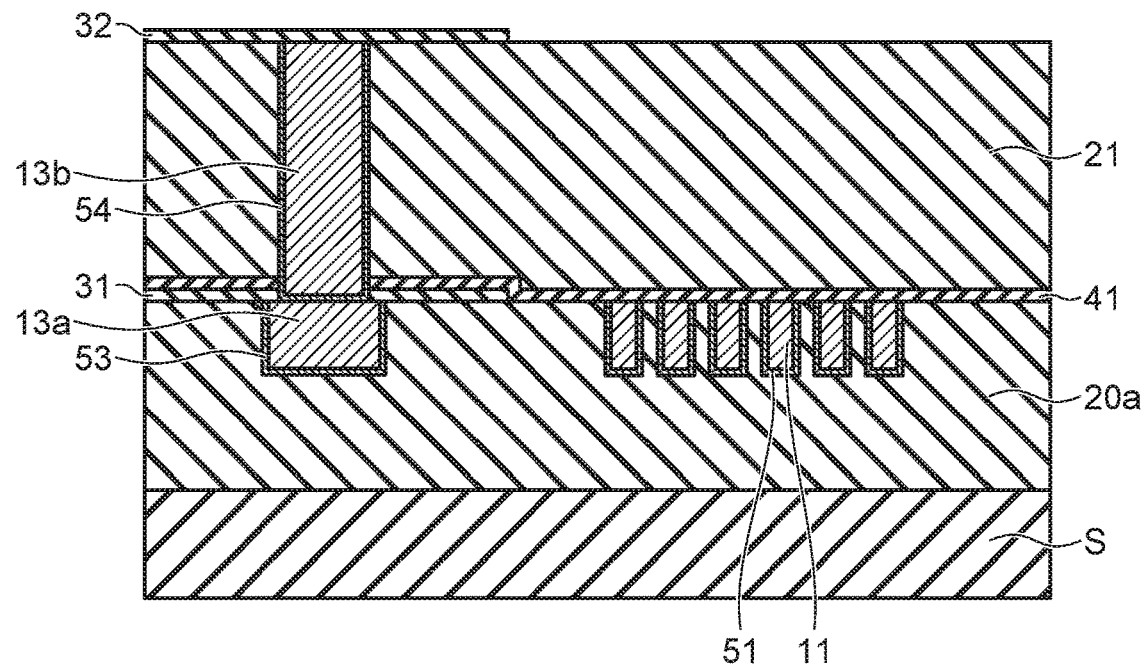
FIGS. 9A and 9B are process cross-sectional views illustrating manufacturing processes of the digital isolator according to the first modification of the embodiment.

The first insulating portion 21 is formed on the first insulating layer 41 by CVD. The second portion 13b and the conductive layer 54 are formed by performing processes similar to the processes illustrated in FIG. 4A. The second layer 32 that covers the second portion 13b and the first insulating portion 21 is formed by CVD. As illustrated in FIG. 9A, a portion of the second layer 32 positioned above the first metal portion 11 is removed by RIE. As illustrated in FIG. 8B, the second insulating layer 42 is formed on the first insulating portion 21 and the second layer 32 by CVD.

The insulating portion 20b is formed on the second insulating layer 42 by CVD. Thereafter, the digital isolator 110 according to the first modification is manufactured by performing processes similar to the processes illustrated in FIG. 5.

The carbon concentration in the first layer 31 is higher than the carbon concentration in the first insulating layer 41. Therefore, the electrical resistivity of the first layer 31 is lower than the electrical resistivity of the first insulating layer 41. Because the first layer 31 is provided between the first metal portion 11 and the first insulating layer 41, there is a possibility that a leakage current may flow between the first metal portion 11 and the third metal portion 13 via the first layer 31.

Heat is generated if a leakage current flows between the first metal portion 11 and the third metal portion 13. The heat that is generated increases as the leakage current increases. Therefore, particularly when a high voltage is applied between the first metal portion 11 and the second metal portion 12, the heat generation increases, which may cause operation errors of the digital isolator, etc.

In the digital isolator 110, the first layer 31 is not provided between the first metal portion 11 and the second metal portion 12. Therefore, the flow of the leakage current between the first metal portion 11 and the third metal portion 13 via the first layer 31 can be suppressed. Thereby, the heat generation due to the leakage current can be reduced; and the reliability of the digital isolator 110 can be increased.

Similarly to the first layer 31, the electrical resistivity of the second layer 32 is lower than the electrical resistivity of the second insulating layer 42. The second layer 32 is not provided around the bottom portion of the second metal portion 12 and is separated from the second metal portion 12. Therefore, the flow of a leakage current between the second metal portion 12 and the third metal portion 13 via the second layer 32 can be suppressed. The reliability of the digital isolator 110 can be increased thereby.

In the digital isolator 110, the first layer 31 is separated from the first metal portion 11. Therefore, the first layer 31 may be conductive or semiconductive. Similarly, the second layer 32 may be conductive or semiconductive. For example, the first layer 31 and the second layer 32 are semiconductive and include silicon and carbon. Or, the first layer 31 and the second layer 32 are conductive and include titanium. The first layer 31 and the second layer 32 may include a nitride of titanium. Also, the material that is included in the second layer 32 may be different from the material included in the first layer 31.

When the first layer 31 is semiconductive or conductive, the first layer 31 is electrically connected to the third metal portion 13; and the potential of the first layer 31 is fixed to the reference potential. If the distance between the first layer 31 and the first metal portion 11 is short, there is a possibility that the electric field intensity between the first layer 31 and the first metal portion 11 may increase. Accordingly, when the first layer 31 is conductive or semiconductive, it is favorable for the first layer 31 and the first metal portion 11 to be separated sufficiently according to the voltage generated by the first metal portion 11. Similarly, when the second layer 32 is semiconductive or conductive, it is favorable for the second layer 32 and the second metal portion 12 to be separated sufficiently according to the voltage applied to the second metal portion 12.

Second Modification

Figure 10:
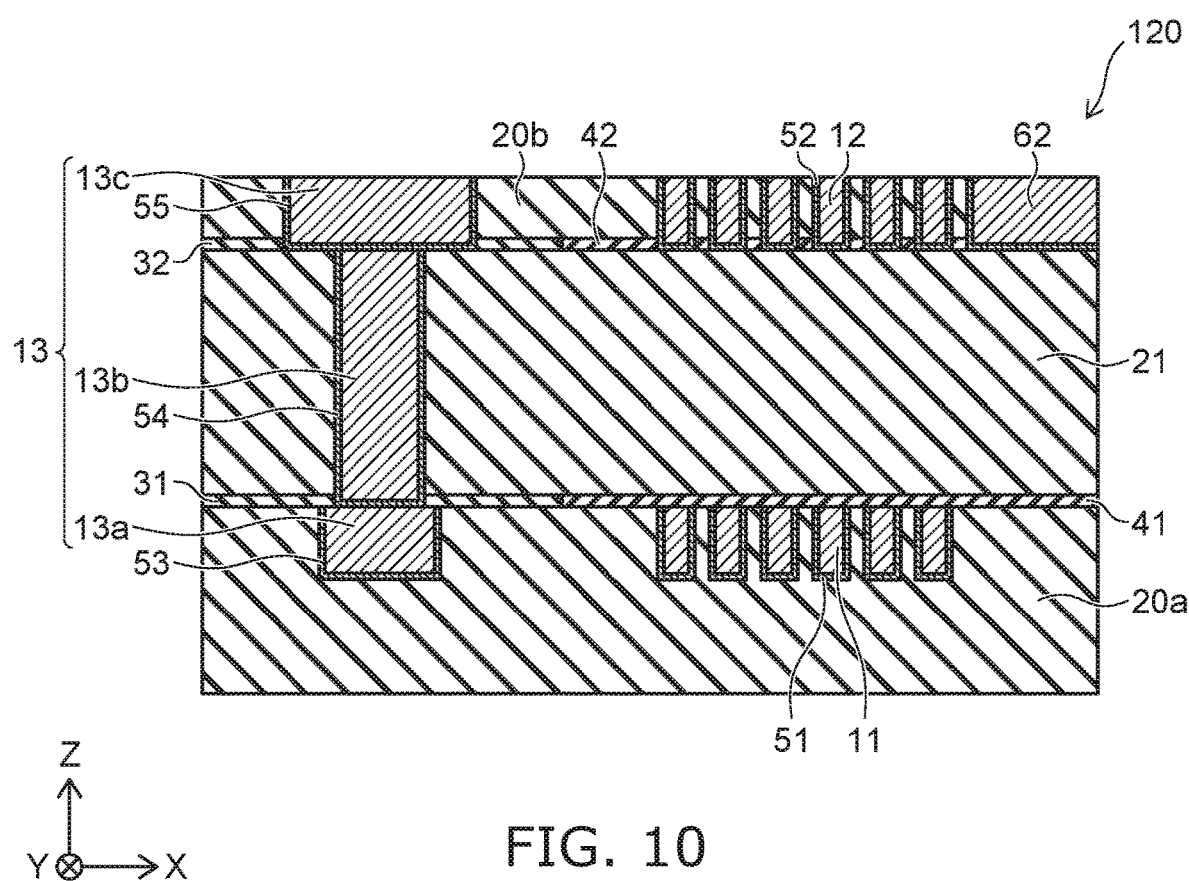
FIG. 10 is a cross-sectional view illustrating a portion of a digital isolator according to a second modification of the embodiment.

FIG. 10 is a cross-sectional view illustrating a portion of a digital isolator according to a second modification of the embodiment.

In the digital isolator 120 according to the second modification as illustrated in FIG. 10, the first insulating layer 41 does not contact the conductive layer 54 and is separated from the conductive layer 54. For example, the first insulating layer 41 does not overlap the first layer 31 in the Z-direction and is arranged with the first layer 31 in the X-direction and the Y-direction. The first insulating layer 41 may contact the first layer 31 or may be separated from the first layer 31.

Similarly, the second insulating layer 42 does not contact the conductive layer 55 and is separated from the conductive layer 55. For example, the second insulating layer 42 does not overlap the second layer 32 in the Z-direction and is arranged with the second layer 32 in the X-direction and the Y-direction. The second insulating layer 42 may contact the second layer 32 or may be separated from the second layer 32.

FIG. 11A to FIG. 12B are process cross-sectional views illustrating manufacturing processes of the digital isolator according to the second modification of the embodiment.

Figure 11A:
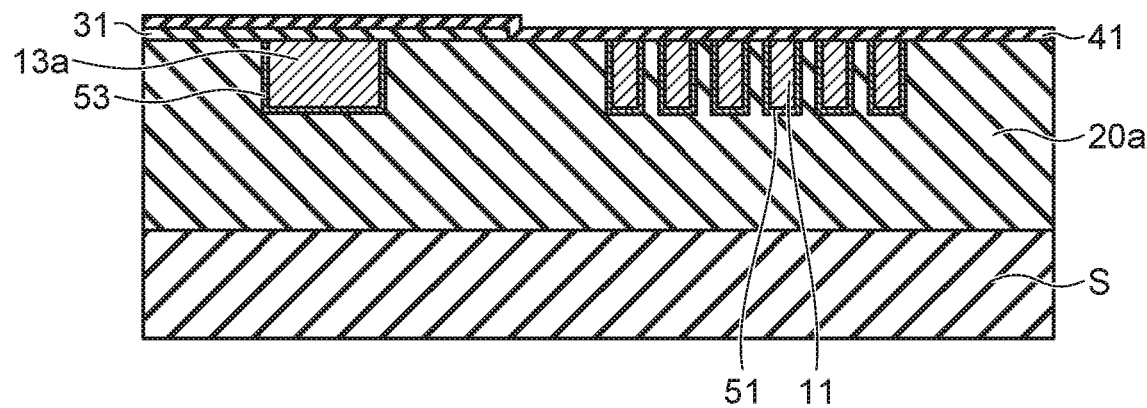
FIGS. 11A and 11B are process cross-sectional views illustrating manufacturing processes of the digital isolator according to the second modification of the embodiment.
Figure 11B:
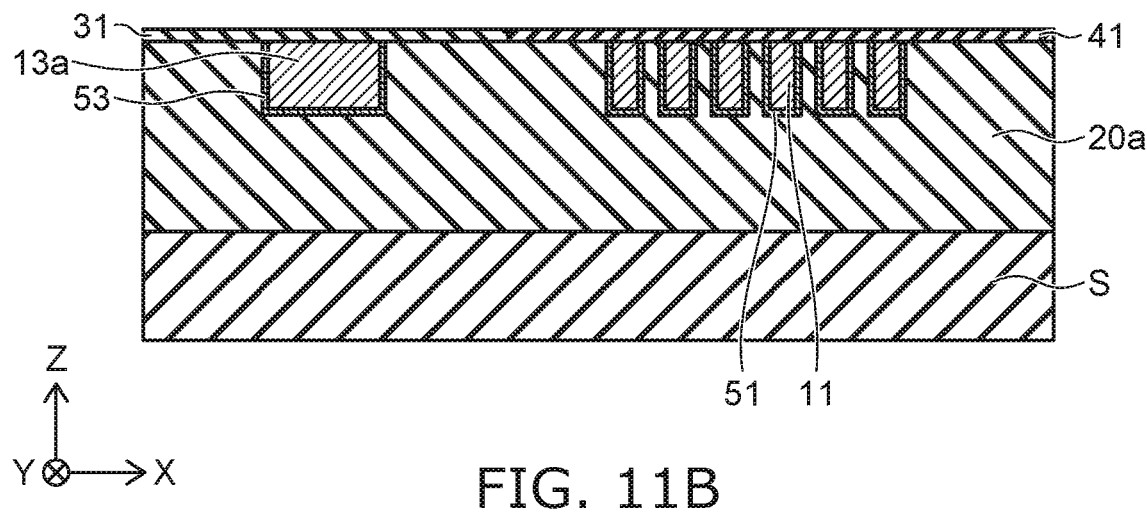

As illustrated in FIG. 11A, the first layer 31 and the first insulating layer 41 are formed by performing processes similar to the processes illustrated in FIG. 3A, FIG. 8A, and FIG. 8B. As illustrated in FIG. 11B, a portion of the first insulating layer 41 provided on the first layer 31 is removed by RIE. At this time, the RIE may be performed so that the first insulating layer 41 after the removal is separated from the first layer 31.

Figure 9B:
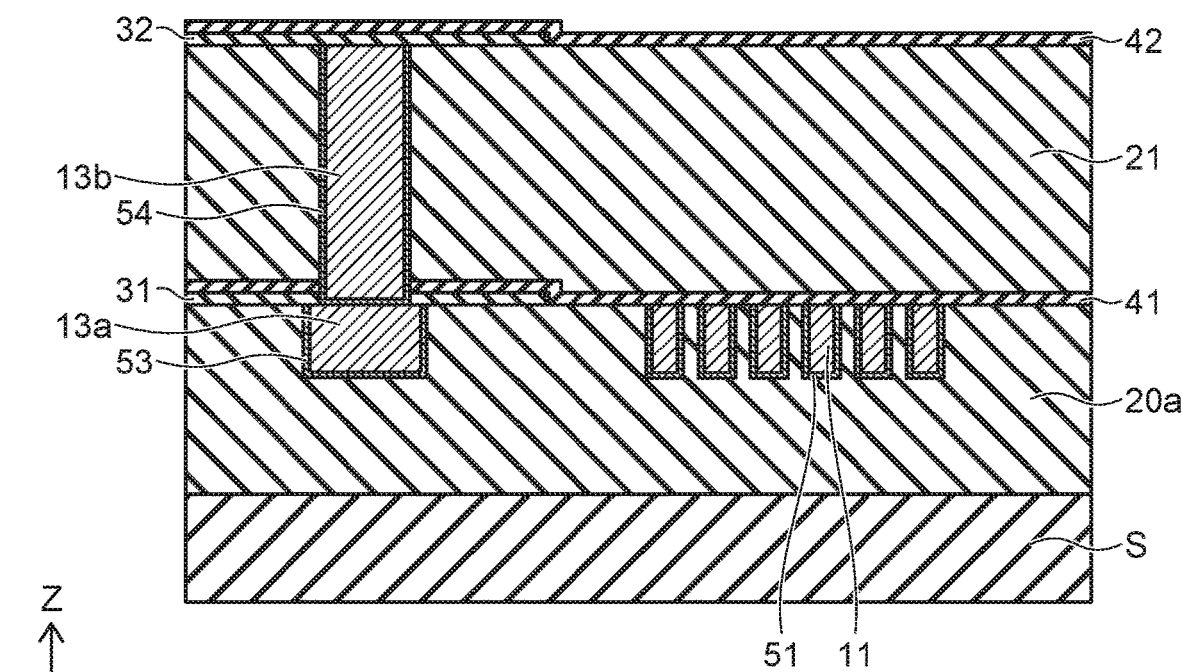
Figure 12A:
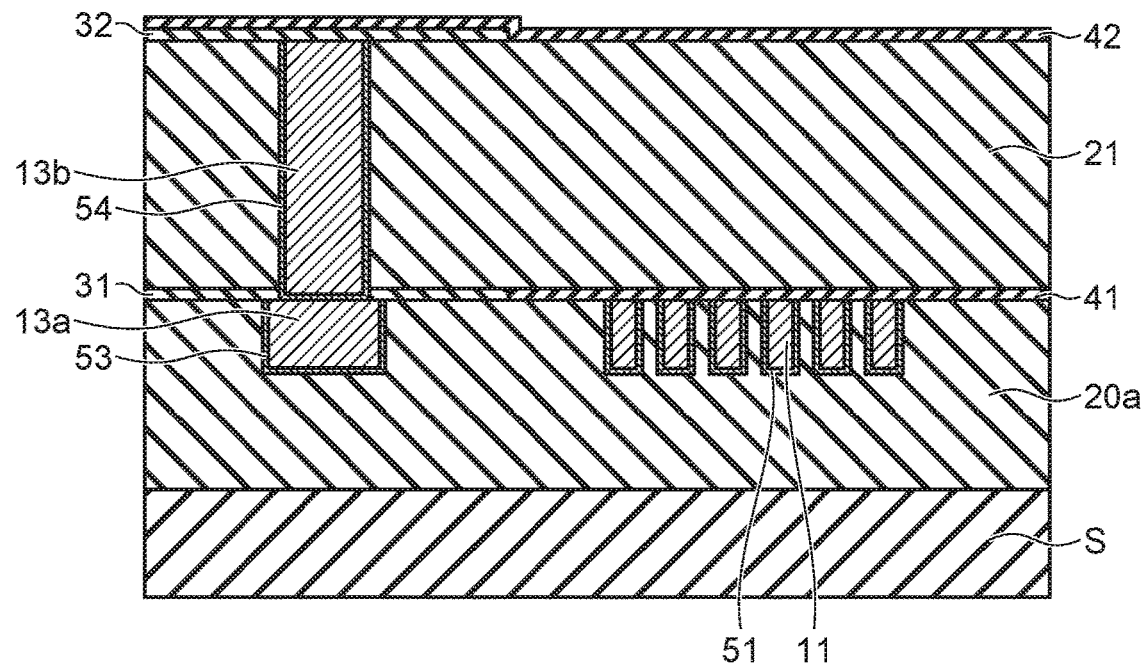
FIGS. 12A and 12B are process cross-sectional views illustrating manufacturing processes of the digital isolator according to the second modification of the embodiment.
Figure 12B:
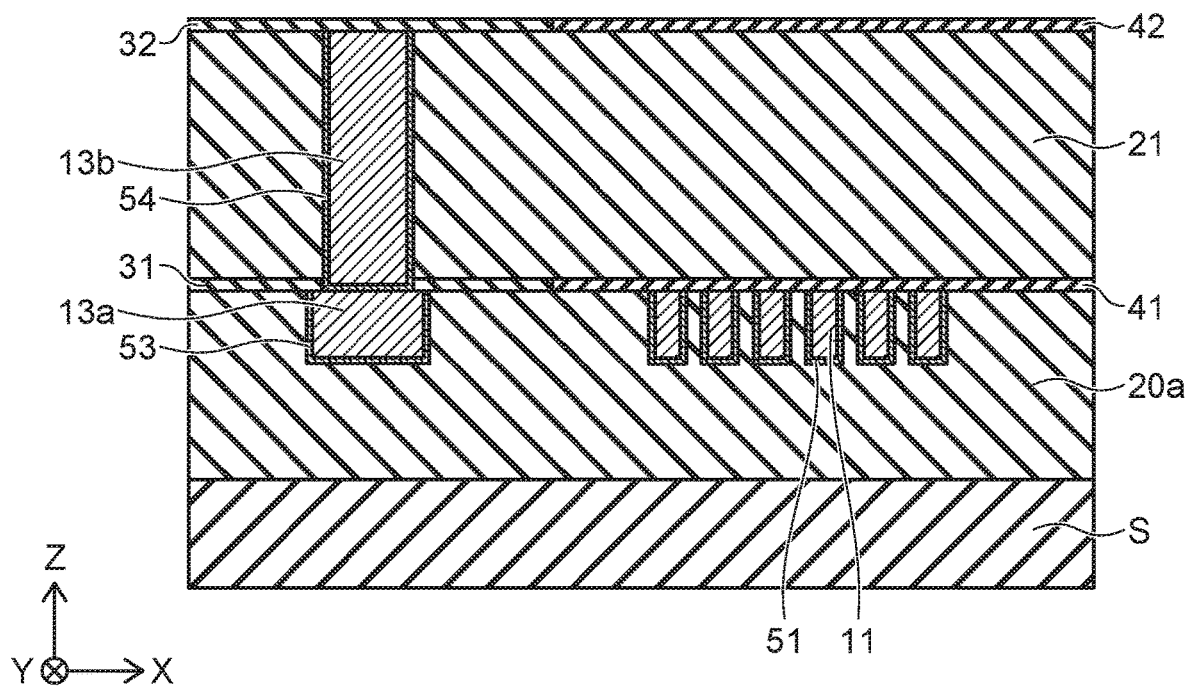

The first insulating portion 21 is formed on the first layer 31 and the first insulating layer 41 by CVD. As illustrated in FIG. 12A, the second portion 13b, the conductive layer 54, the second layer 32, and the second insulating layer 42 are formed by performing processes similar to the processes illustrated in FIG. 4A, FIG. 9A, and FIG. 9B. As illustrated in FIG. 12B, a portion of the second insulating layer 42 provided on the second layer 32 is removed by RIE. At this time, the RIE may be performed so that the second insulating layer 42 after the removal is separated from the second layer 32. The insulating portion 20b is formed on the second layer 32 and the second insulating layer 42 by CVD. Thereafter, the digital isolator 120 according to the second modification is manufactured by performing processes similar to the processes illustrated in FIG. 5.

Because the first insulating layer 41 is separated from the conductive layer 54, application of the stress from the conductive layer 54 to the first insulating layer 41 can be avoided. The peeling of the first insulating layer 41 due to the stress applied from the conductive layer 54 can be prevented more reliably thereby. Similarly, because the second insulating layer 42 is separated from the conductive layer 55, application of the stress from the conductive layer 55 to the second insulating layer 42 can be avoided. The peeling of the second insulating layer 42 due to the stress applied from the conductive layer 55 can be prevented more reliably thereby.

Third Modification

Figure 13:
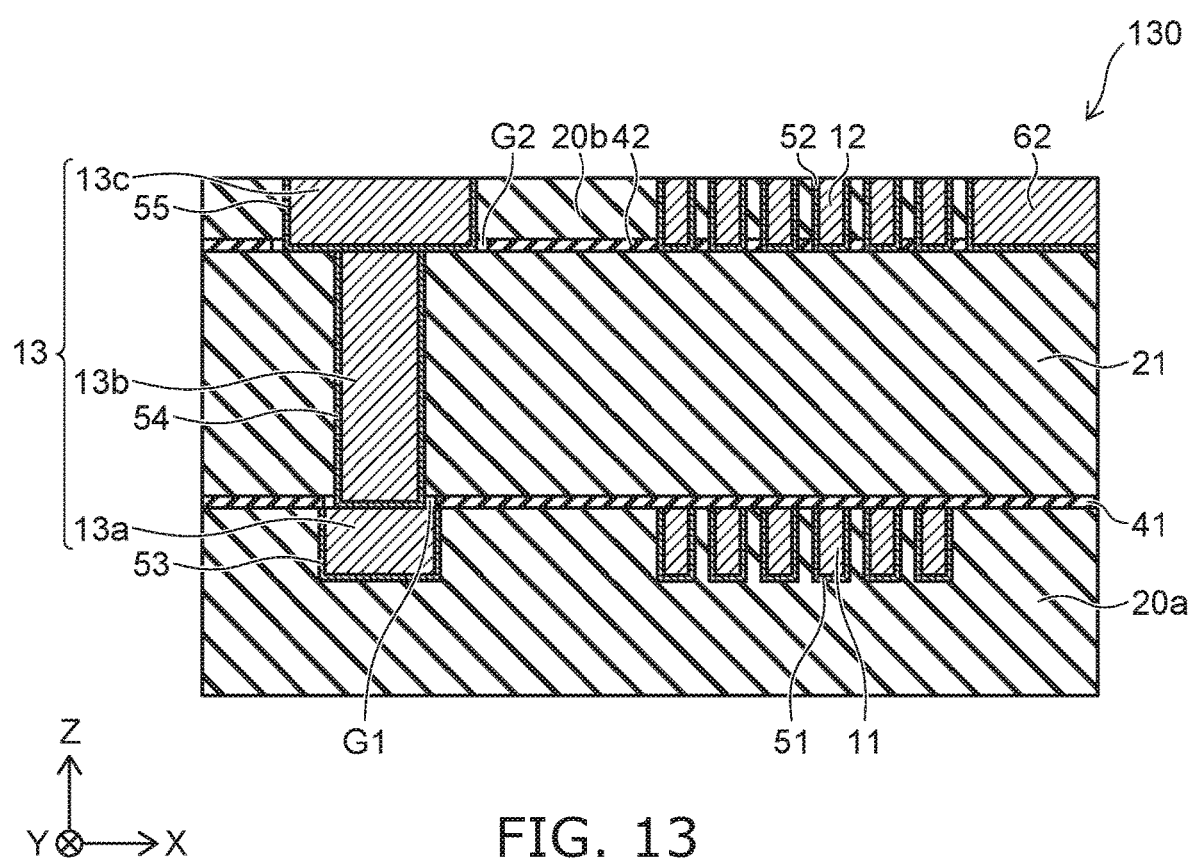
FIG. 13 is a cross-sectional view illustrating a portion of a digital isolator according to a third modification of the embodiment.

FIG. 13 is a cross-sectional view illustrating a portion of a digital isolator according to a third modification of the embodiment.

In the digital isolator 130 according to the third modification, the first insulating layer 41 is provided on the first metal portion 11 and around the bottom portion of the second portion 13b and contacts the first portion 13a. The second insulating layer 42 is provided around the bottom portion of the third portion 13c and around the bottom portion of the second metal portion 12. In other words, the first layer 31 and the second layer 32 are not provided in the digital isolator 130.

A gap G1 is provided between the first insulating layer 41 and the conductive layer 54. Therefore, the first insulating layer 41 is separated from the conductive layer 54 in the X-direction and the Y-direction. Similarly, a gap G2 is provided between the second insulating layer 42 and the conductive layer 55. Therefore, the second insulating layer 42 is separated from the conductive layer 55 in the X-direction and the Y-direction.

FIG. 14A to FIG. 18B are process cross-sectional views illustrating manufacturing processes of the digital isolator according to the third modification of the embodiment.

Figure 14A:
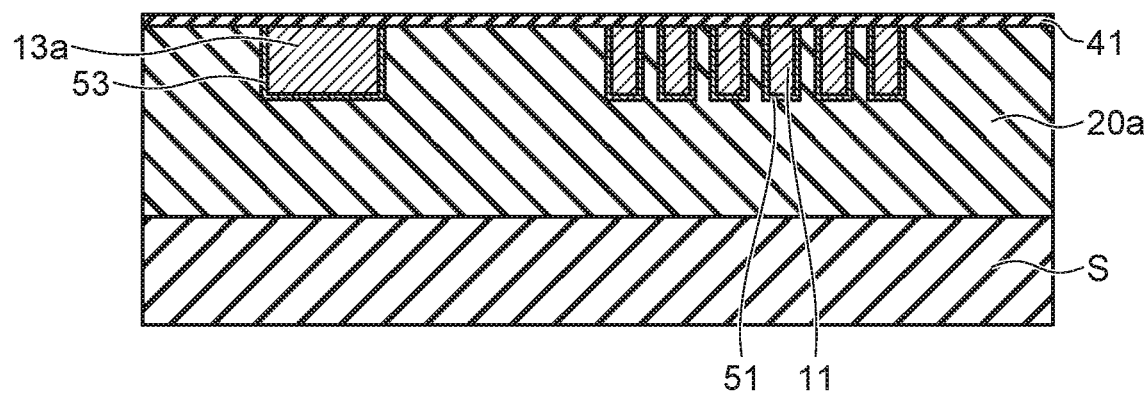
FIGS. 14A and 14B are process cross-sectional views illustrating manufacturing processes of the digital isolator according to the third modification of the embodiment.
Figure 14B:
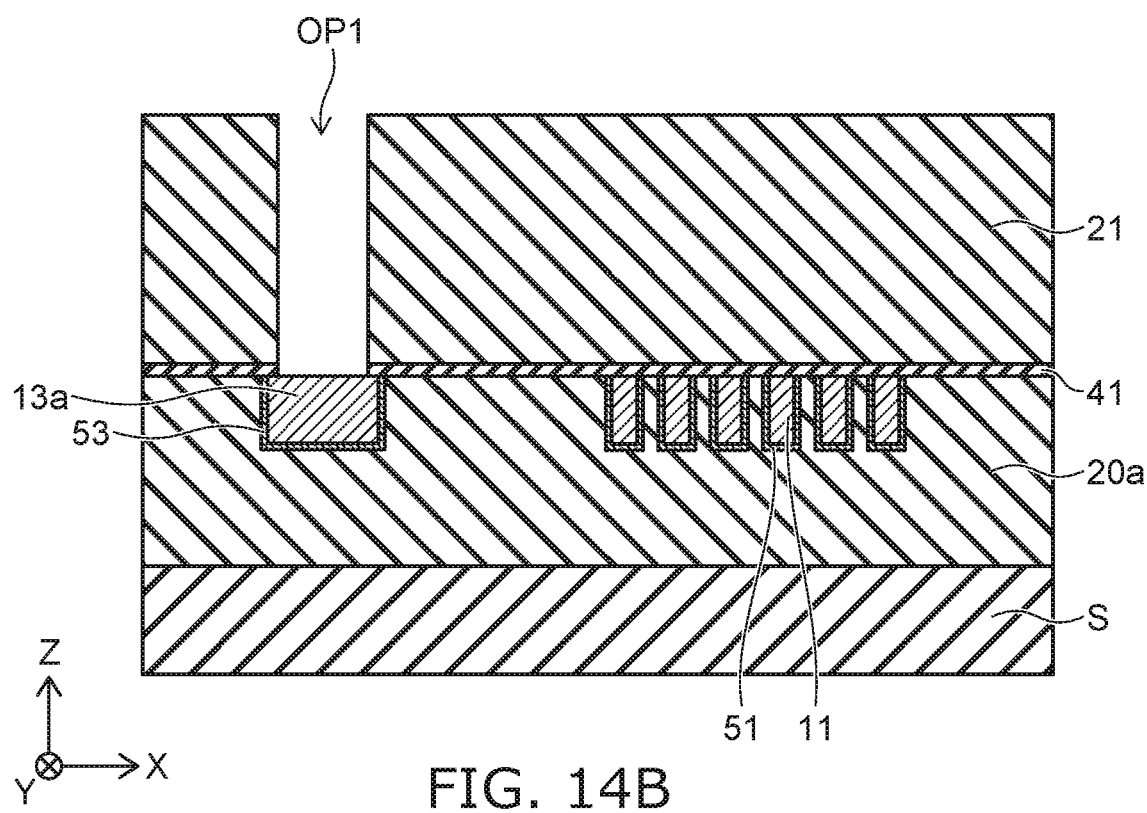

First, the first metal portion 11, the conductive layer 51, the first portion 13a, and the conductive layer 53 are formed by performing processes similar to the processes illustrated in FIG. 3A. As illustrated in FIG. 14A, the first insulating layer 41 that covers the first metal portion 11 and the first portion 13a is formed by CVD. The first insulating portion 21 is formed on the first insulating layer 41 by CVD. As illustrated in FIG. 14B, an opening OP1 is formed by removing a portion of the first insulating portion 21 and a portion of the first insulating layer 41 by RIE.

Figure 15A:
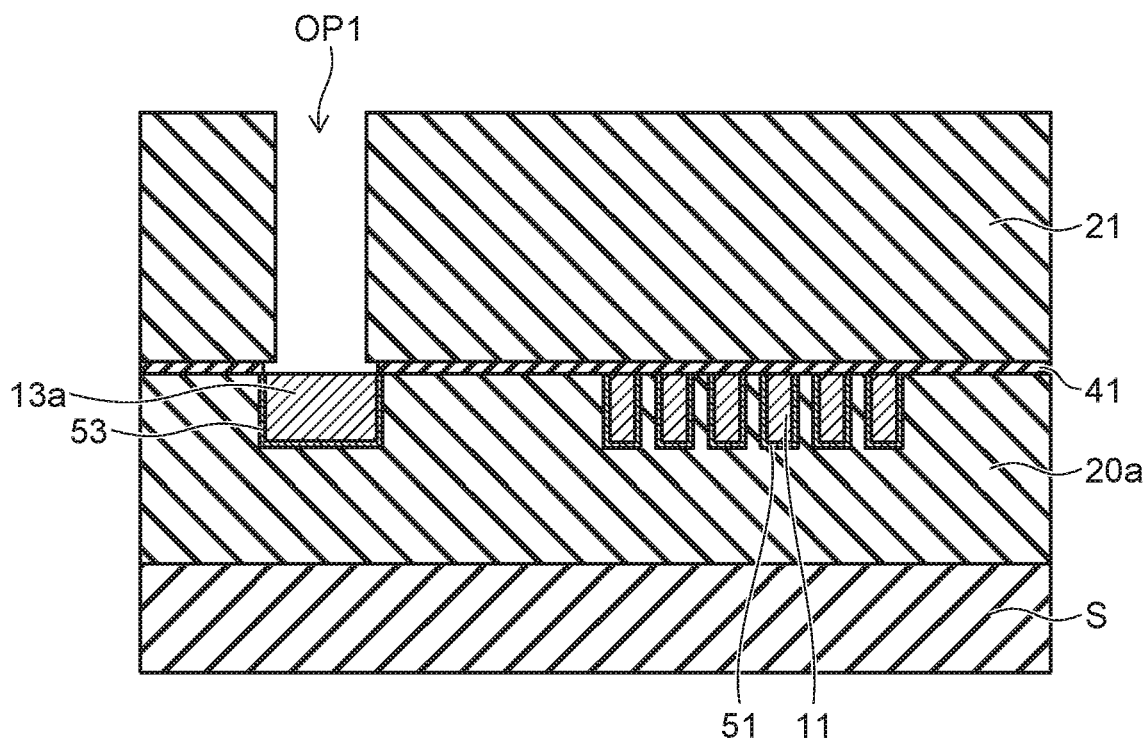
FIGS. 15A and 15B are process cross-sectional views illustrating manufacturing processes of the digital isolator according to the third modification of the embodiment.

A portion of the first insulating layer 41 is removed via the opening OP1 by isotropic etching such as wet etching, chemical dry etching (CDE), etc. The chemical liquid or the gas for removing the first layer 31 and the first insulating layer 41 described above can be used as the etchant or the etching gas. Thereby, as illustrated in FIG. 15A, the end surface of the first insulating layer 41 exposed in the opening OP1 recedes. By the end surface of the first insulating layer 41 receding, the bottom portion side surface of the opening OP1 is recessed partially.

Figure 15B:
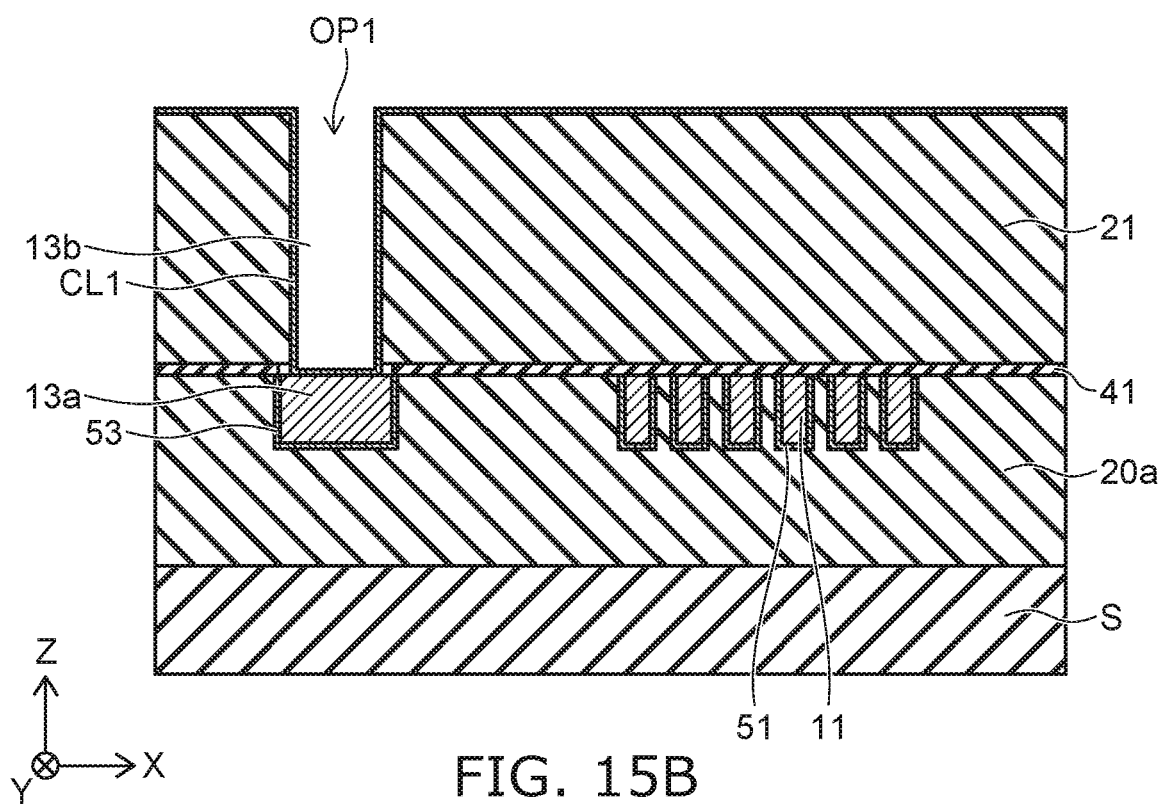
Figure 16A:
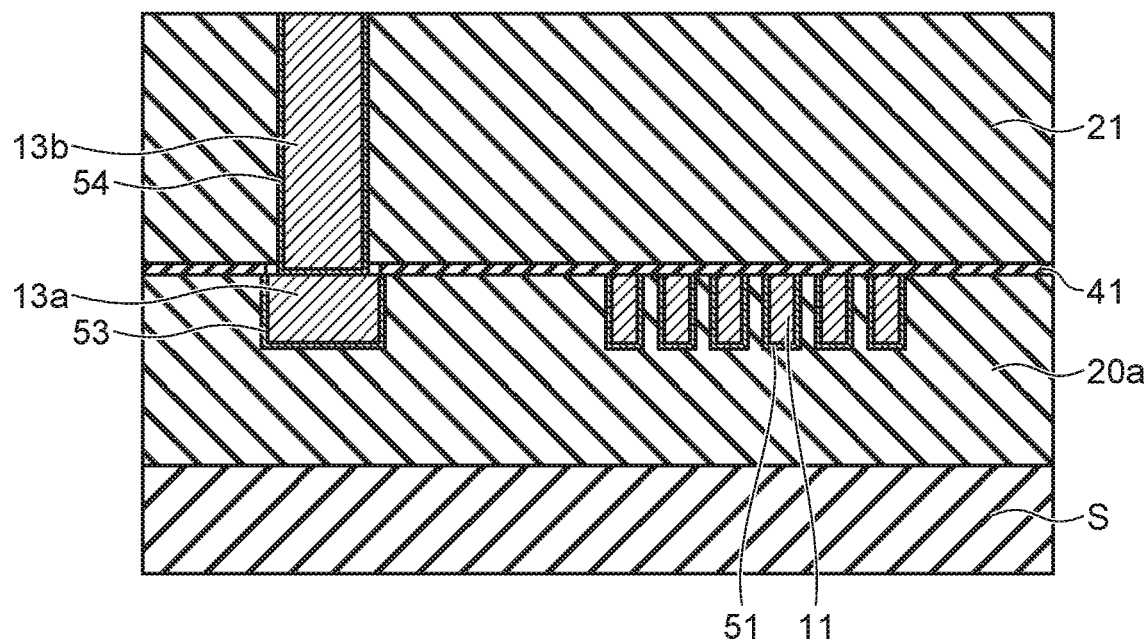
FIGS. 16A and 16B are process cross-sectional views illustrating manufacturing processes of the digital isolator according to the third modification of the embodiment.

As illustrated in FIG. 15B, a conductive layer CL1 is formed along the inner surface of the opening OP1 and the upper surface of the first insulating portion 21 by sputtering. At this time, the recess of the bottom portion side surface of the opening OP1 is plugged with the conductive layer CL1; and the gap G1 is formed. A metal layer that fills the opening OP1 is formed on the conductive layer CL1 by sputtering and electroplating. The upper surface of the metal layer and the upper surface of the conductive layer CL1 are caused to recede by CMP until the upper surface of the first insulating portion 21 is exposed. Thereby, the second portion 13b and the conductive layer 54 are formed as illustrated in FIG. 16A.

Figure 16B:
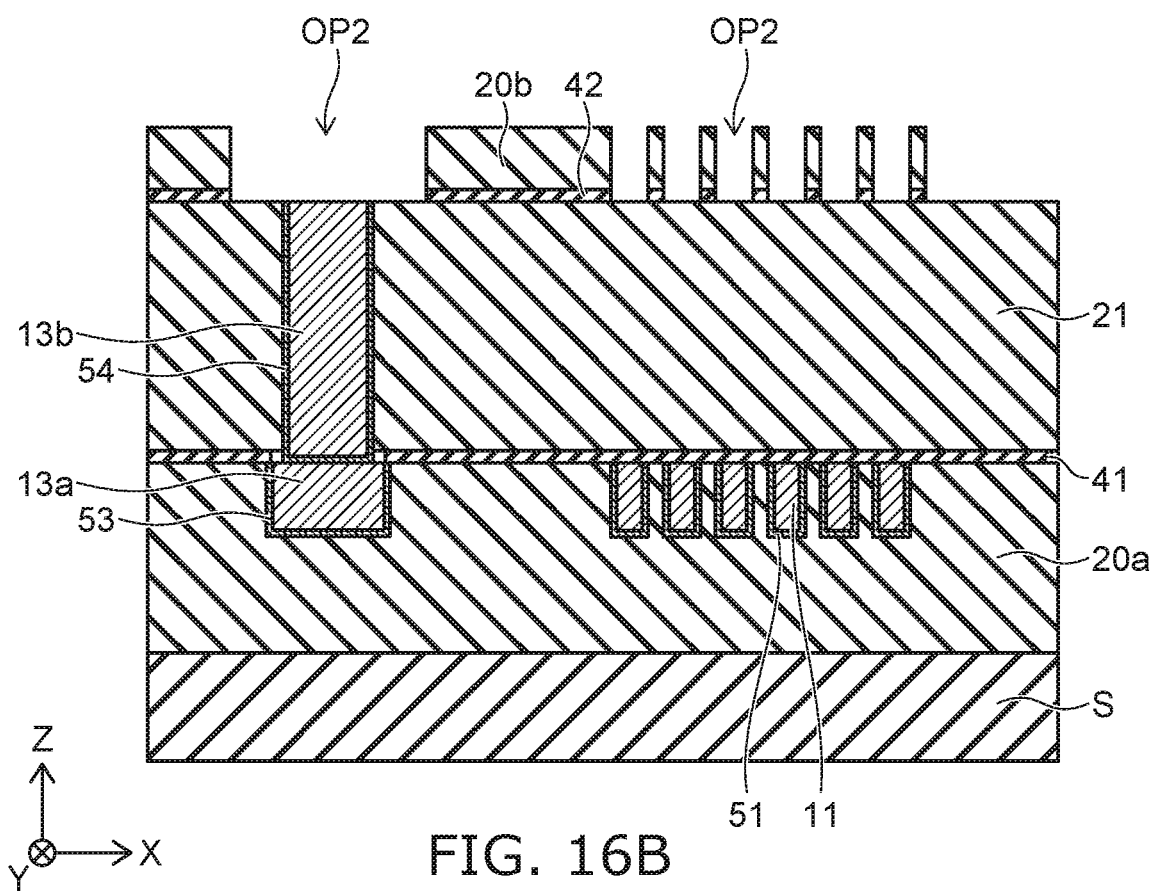

The second insulating layer 42 and the insulating portion 20b are formed on the second portion 13b and the first insulating portion 21 by CVD. As illustrated in FIG. 16B, an opening OP2 is formed above the first metal portion 11 and the second portion 13b by removing a portion of the insulating portion 20b and a portion of the second insulating layer 42 by RIE.

Figure 17A:
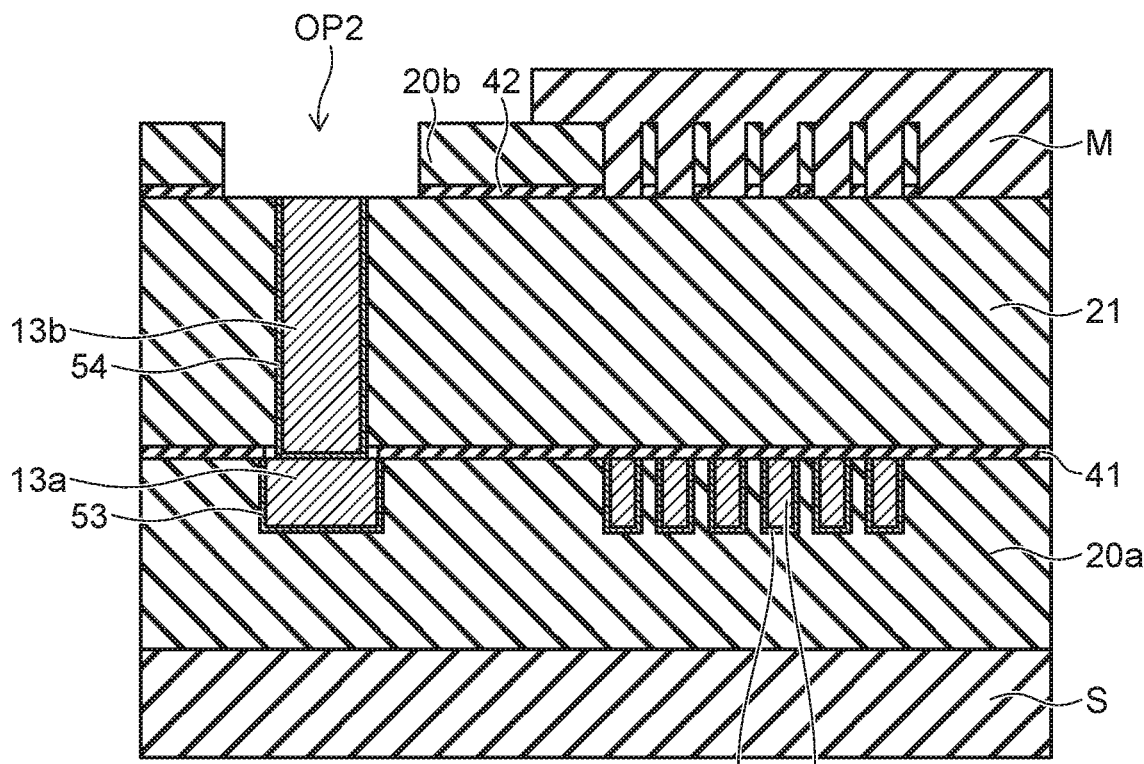
FIGS. 17A and 17B are process cross-sectional views illustrating manufacturing processes of the digital isolator according to the third modification of the embodiment.
Figure 17B:
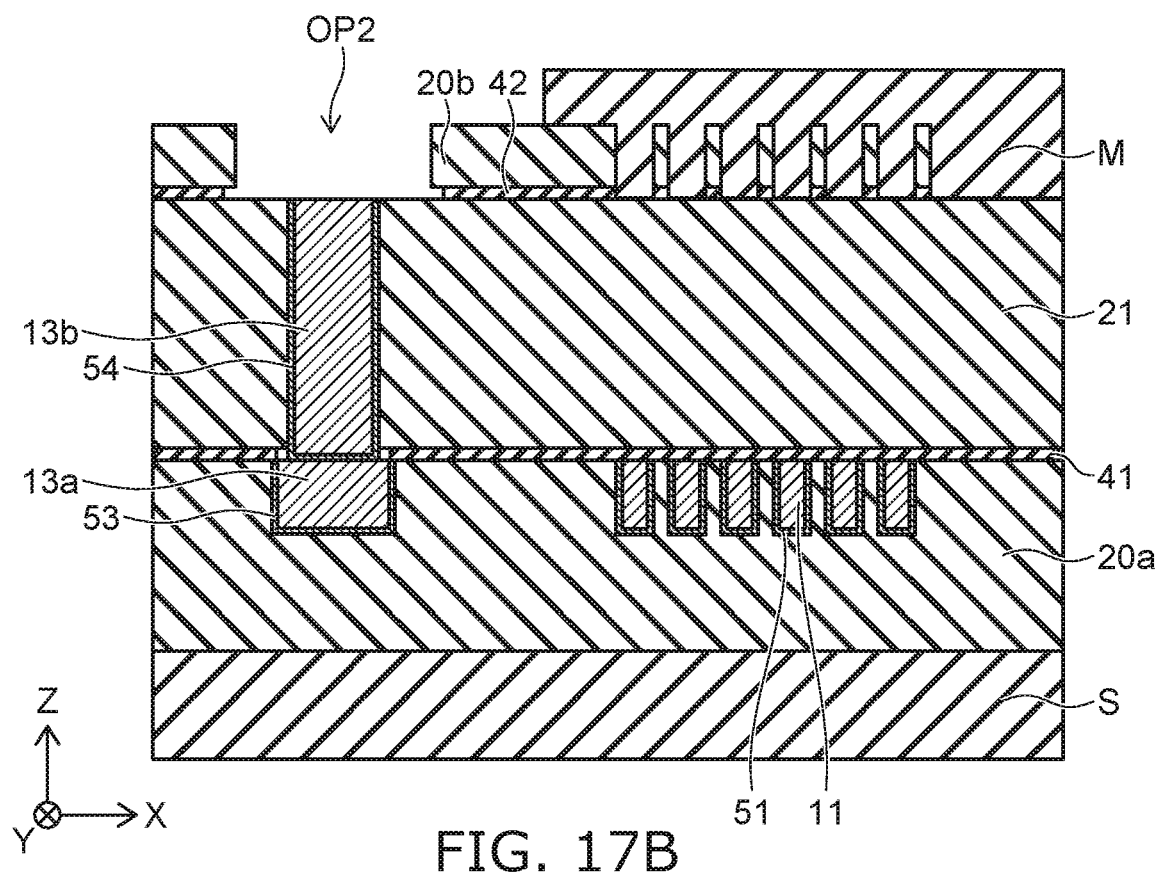

As illustrated in FIG. 17A, a mask M that covers the opening formed above the first metal portion 11 is formed. The opening that is formed above the second portion 13b is not covered with the mask M and is exposed. A portion of the second insulating layer 42 is removed via the opening OP2 by isotropic etching. The chemical liquid or the gas for removing the first layer 31 and the first insulating layer 41 described above can be used as the etchant or the etching gas. Thereby, as illustrated in FIG. 17B, the end surface of the second insulating layer 42 exposed in the opening OP2 recedes. Due to the end surface of the second insulating layer 42 receding, the bottom portion side surface of the opening OP2 is recessed partially.

Figure 18A:
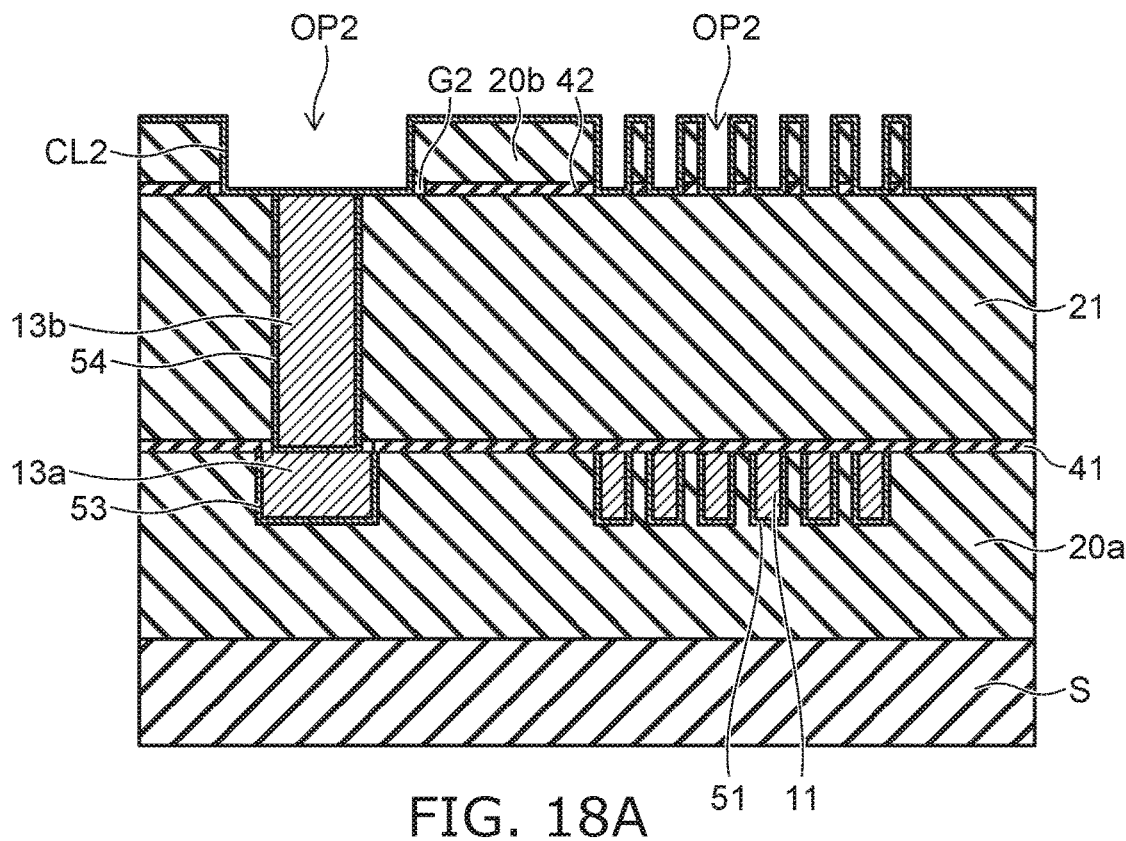
FIGS. 18A and 18B are process cross-sectional views illustrating manufacturing processes of the digital isolator according to the third modification of the embodiment.
Figure 18B:
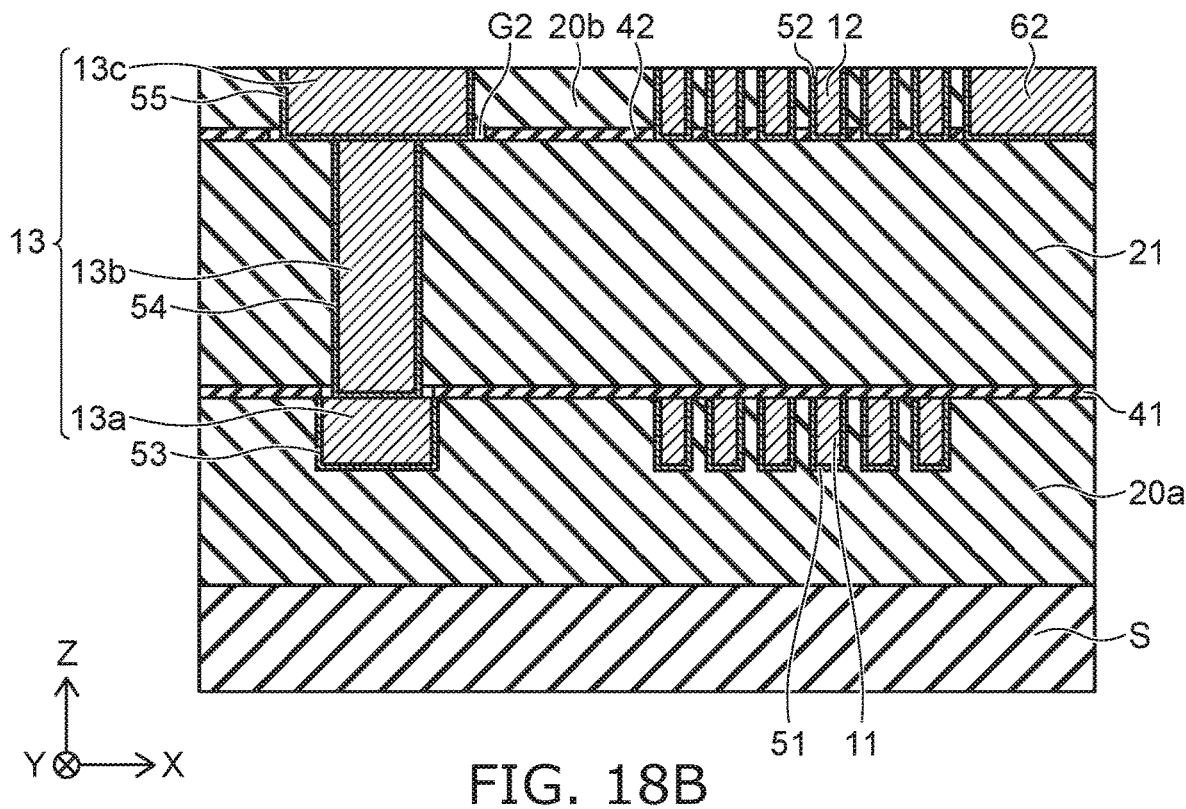

The mask M is removed; and a conductive layer CL2 is formed along the inner surface of the opening OP2 and the upper surface of the insulating portion 20b by sputtering as illustrated in FIG. 18A. At this time, the recess of the bottom portion side surface of the opening OP2 is plugged with the conductive layer CL2; and a gap G2 is formed. A metal layer that fills the opening OP2 is formed on the conductive layer CL2 by sputtering and electroplating. The upper surface of the metal layer and the upper surface of the conductive layer CL2 are caused to recede by CMP until the upper surface of the insulating portion 20b is exposed. Thereby, the third portion 13c and the second metal portion 12 are formed as illustrated in FIG. 18B. Thus, the digital isolator 130 according to the third modification is manufactured.

In the digital isolator 130, the first insulating layer 41 is separated from the conductive layer 54. Therefore, the first insulating layer 41 is not subjected to stress from the conductive layer 54. Accordingly, the peeling of the first insulating layer 41 caused by the stress of the conductive layer 54 can be suppressed. Similarly, because the second layer 32 is separated from the conductive layer 55, the second layer 32 is not subjected to stress from the conductive layer 55. Accordingly, the peeling of the second insulating layer 42 caused by the stress of the conductive layer 55 can be suppressed.

Fourth Modification

Figure 19:
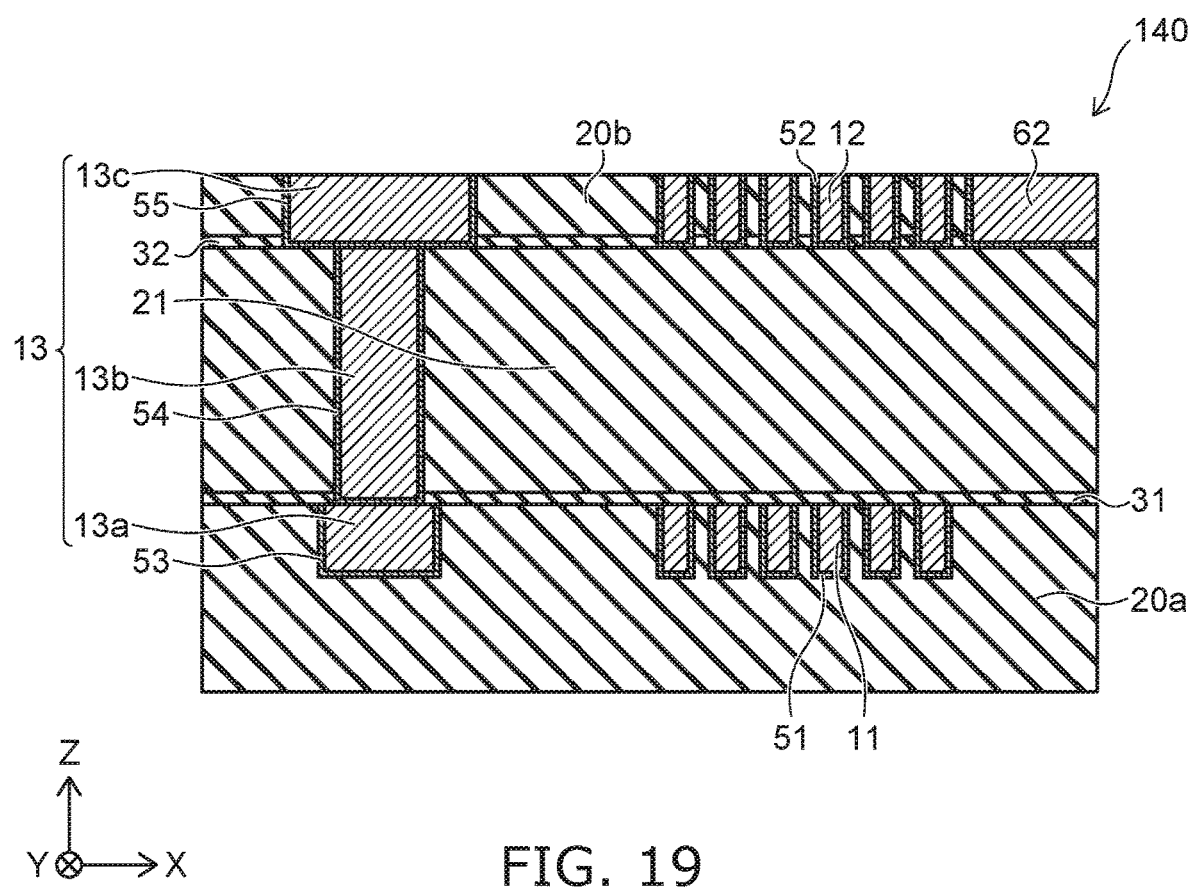
FIG. 19 is a cross-sectional view illustrating a portion of a digital isolator according to a fourth modification of the embodiment.

FIG. 19 is a cross-sectional view illustrating a portion of a digital isolator according to a fourth modification of the embodiment.

In the digital isolator 140 according to the fourth modification, the first insulating layer 41 and the second insulating layer 42 are not provided as illustrated in FIG. 19. The first layer 31 is provided around the bottom portion of the second portion 13b and between the first metal portion 11 and the first insulating portion 21. The second layer 32 is provided around the bottom portion of the third portion 13c and around the bottom portion of the second metal portion 12. The first layer 31 and the second layer 32 are insulative.

By providing the first layer 31, the diffusion of the metal atoms included in the first portion 13a and the first metal portion 11 into the first insulating portion 21 and the insulating portion 20a can be suppressed. The second layer 32 functions as a stopper when forming the opening for forming the second metal portion 12 and the third portion 13c. Because the first insulating layer 41 and the second insulating layer 42 which have relatively high Young's moduli are not provided, the peeling of the layers can be suppressed; and the reliability of the digital isolator 140 can be increased.

However, to reduce the leakage current, it is favorable for the first insulating layer 41 to be provided. Even when the first insulating layer 41 is provided, the peeling of the first insulating layer 41 can be suppressed sufficiently by providing the first layer 31.

Fifth Modification

Figure 20:
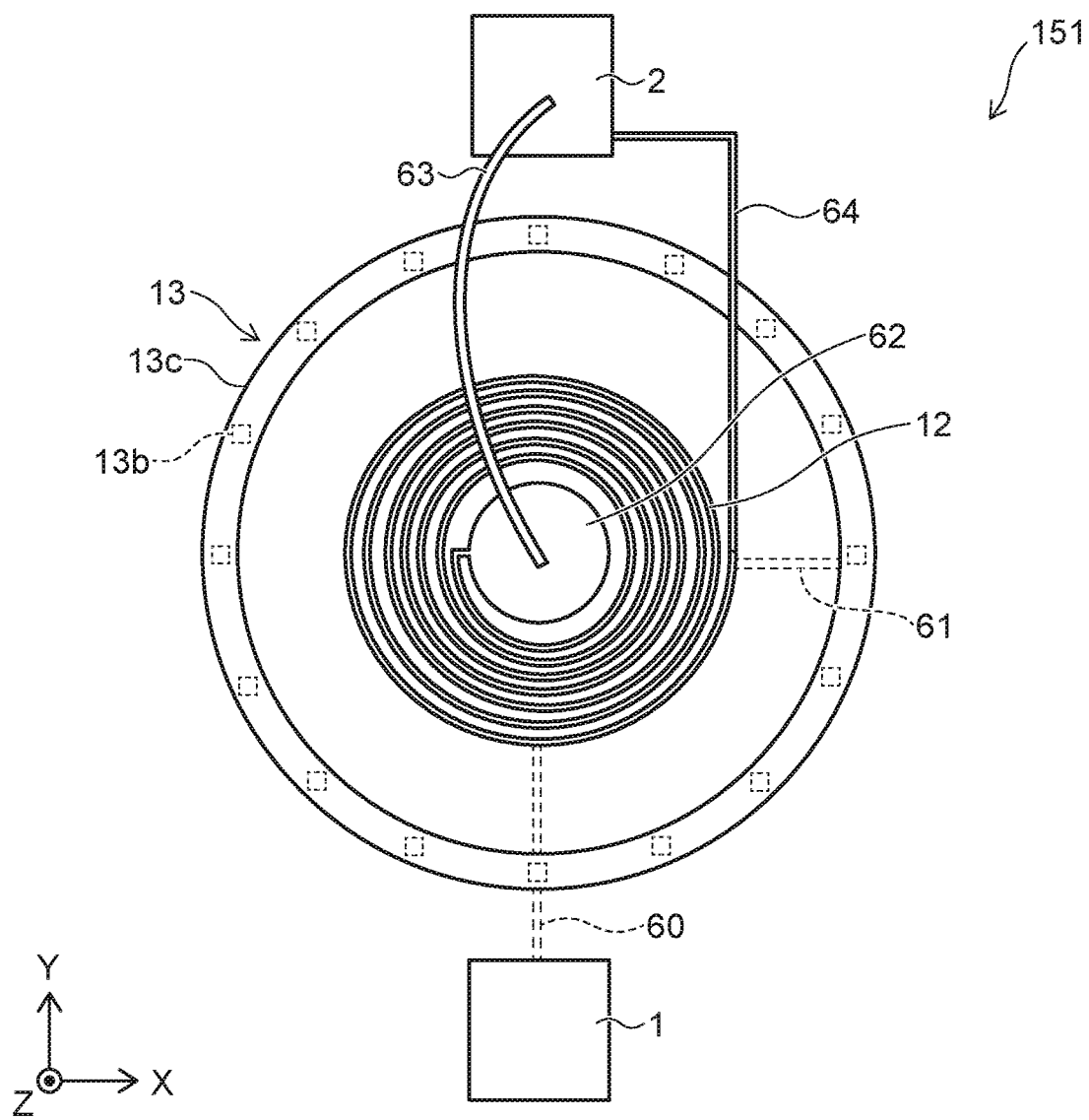
FIG. 20 is a plan view illustrating a digital isolator according to a fifth modification of the embodiment.
Figure 21:
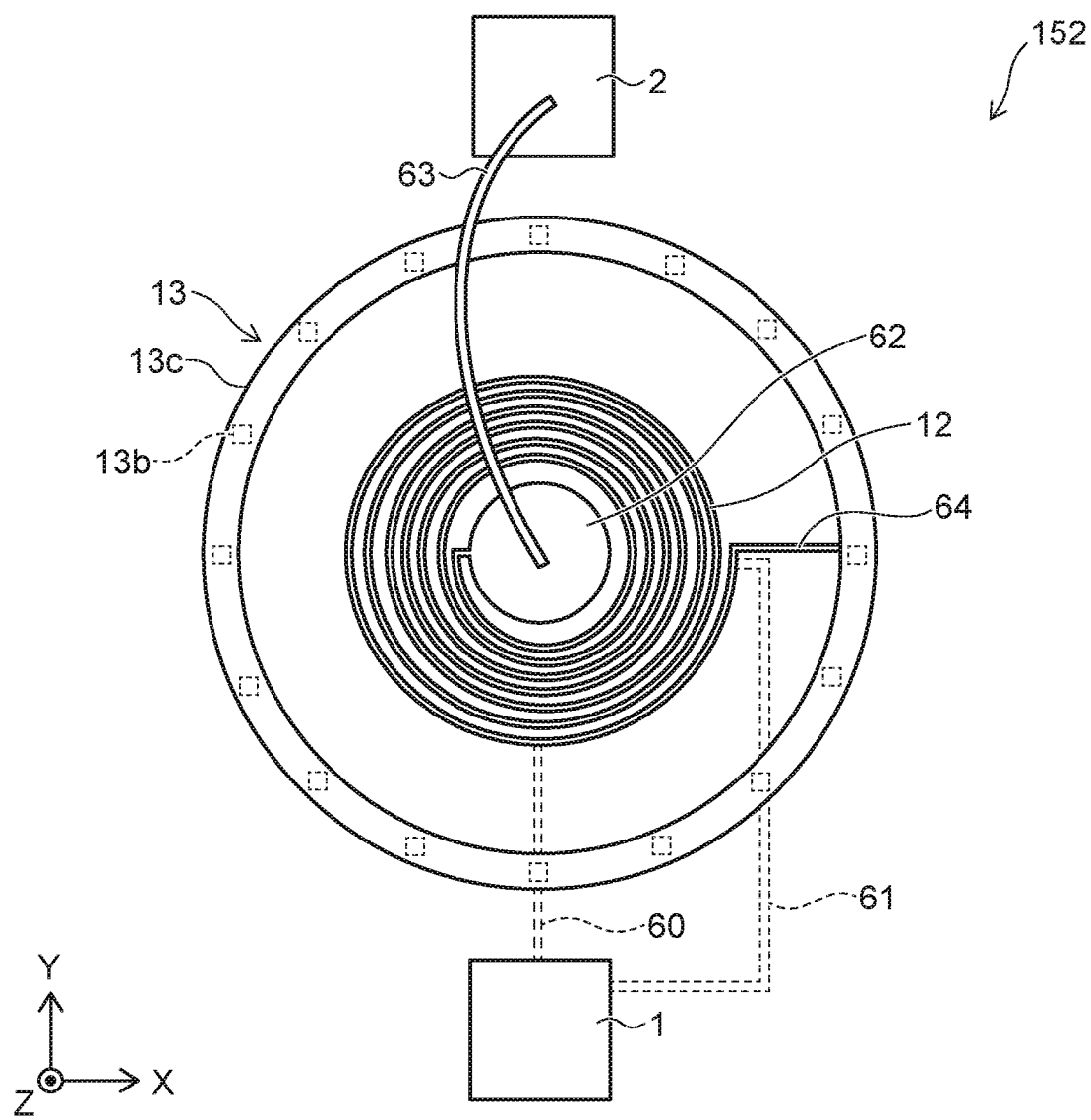
FIG. 21 is a plan view illustrating a digital isolator according to a fifth modification of the embodiment.

FIG. 20 and FIG. 21 are plan views illustrating digital isolators according to a fifth modification of the embodiment.

In a digital isolator 151 illustrated in FIG. 20, the other end of the first metal portion 11 is electrically connected to the first portion 13a of the third metal portion 13 via the wiring 61. The other end of the second metal portion 12 is electrically connected to the second circuit 2 via the wiring 64. The other end of the first metal portion 11 may be connected to the reference potential by wiring, etc., other than the third metal portion 13.

In a digital isolator 152 illustrated in FIG. 21, the other end of the second metal portion 12 is electrically connected to the third portion 13c of the third metal portion 13 via the wiring 64. The other end of the first metal portion 11 is electrically connected to the first circuit 1 via the wiring 61. The other end of the second metal portion 12 may be connected to the reference potential by wiring, etc., other than the third metal portion 13.

As illustrated in FIG. 20 and FIG. 21, one of the first metal portion 11 or the second metal portion 12 may be electrically connected to the third metal portion 13. In such a case as well, similarly to the digital isolator 100, the signal can be transmitted in the state in which the current is blocked (insulated) between the first metal portion 11 and the second metal portion 12.

Sixth Modification

Figure 22:
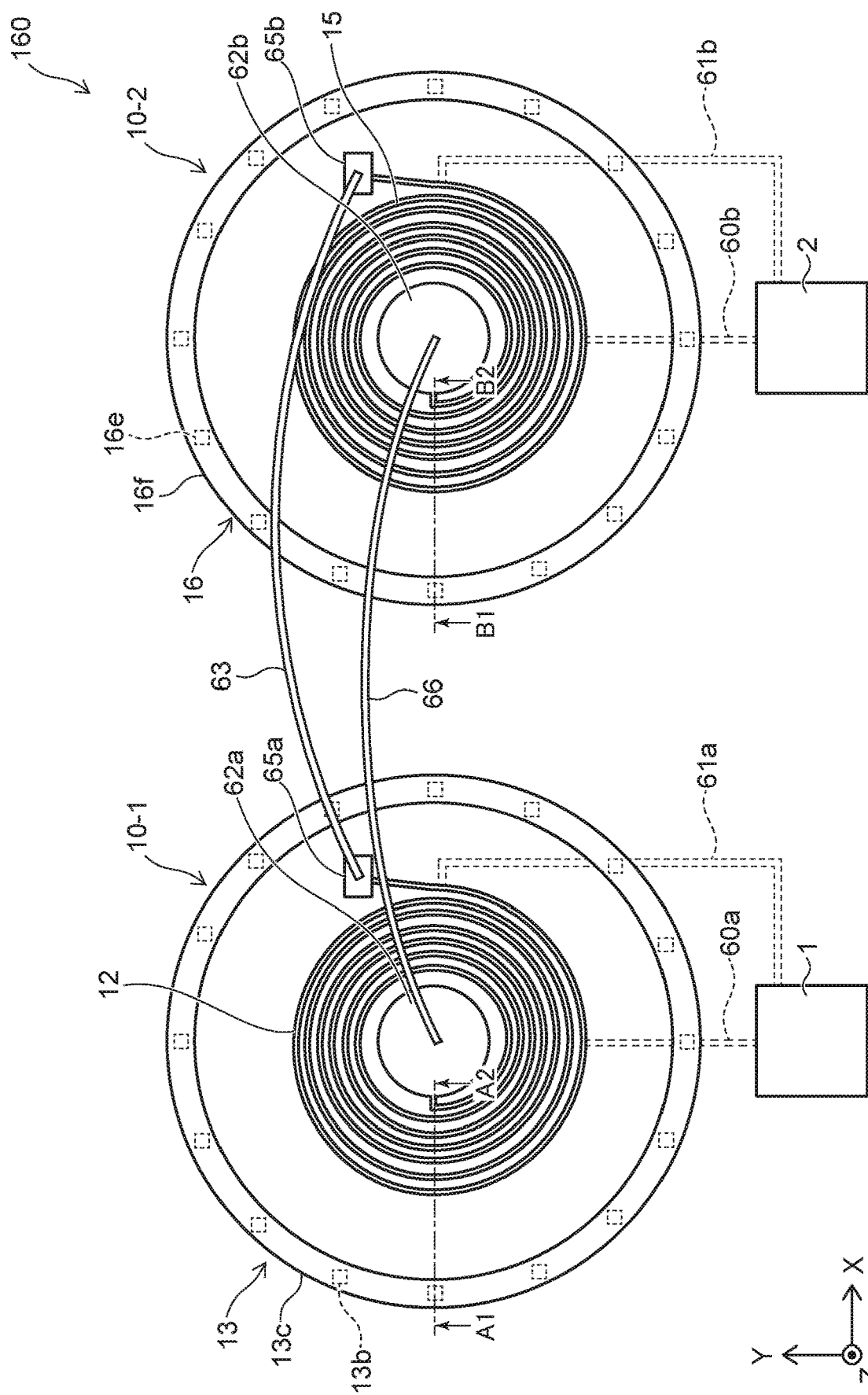
FIG. 22 is a plan view illustrating a digital isolator according to a sixth modification of the embodiment.

FIG. 22 is a plan view illustrating a digital isolator according to a sixth modification of the embodiment.

Figure 23:
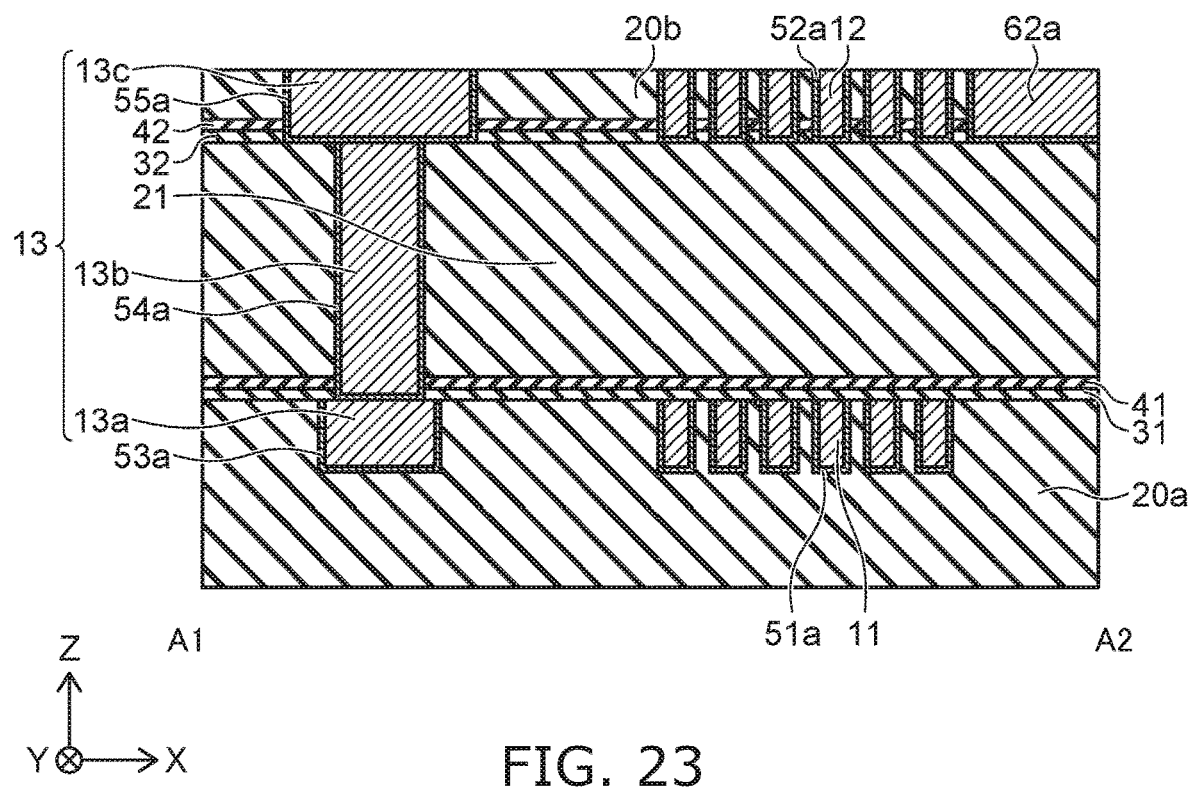
FIG. 23 is an A1-A2 cross-sectional view of FIG. 22.

FIG. 23 is an A1-A2 cross-sectional view of FIG. 22.

Figure 24:
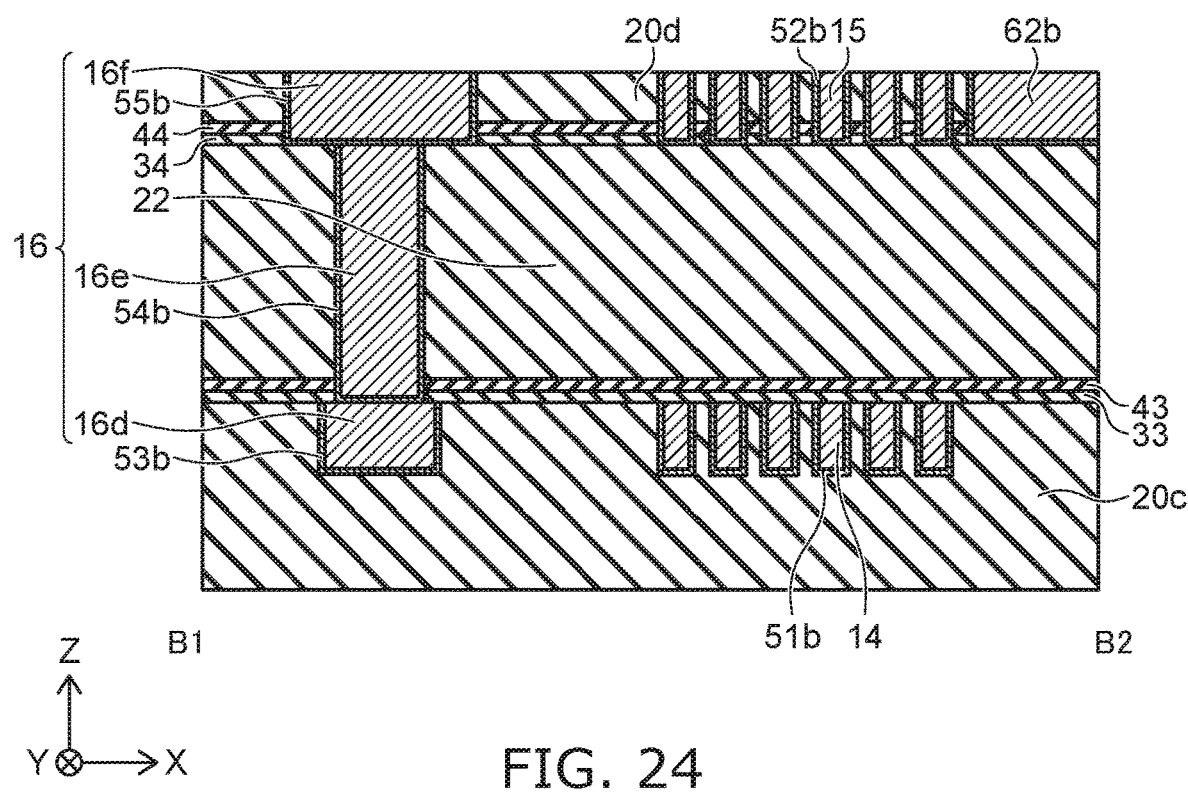
FIG. 24 is a B1-B2 cross-sectional view of FIG. 22.

FIG. 24 is a B1-B2 cross-sectional view of FIG. 22.

The digital isolator 160 according to the sixth modification includes the first circuit 1, the second circuit 2, and a pair of structure bodies 10 (10-1 and 10-2).

As illustrated in FIG. 22 and FIG. 23, the structure body 10-1 includes the first metal portion 11, the second metal portion 12, the third metal portion 13, the first insulating portion 21, the first layer 31, the second layer 32, the first insulating layer 41, the second insulating layer 42, and conductive layers 51a to 55a. The configurations of the components of the structure body 10-1 are similar to those of one of the digital isolators 100 to 130. For example, as illustrated in FIG. 23, the configuration of the A1-A2 cross section of the structure body 10-1 is similar to the configuration of the II-II cross section of the digital isolator 100 illustrated in FIG. 2. Or, the configuration of the structure body 10-1 may be similar to the digital isolator 140; and the first insulating layer 41 and the second insulating layer 42 may not be provided in the structure body 10-1.

The structure body 10-2 includes a fourth metal portion 14, a fifth metal portion 15, a sixth metal portion 16, a second insulating portion 22, a third layer 33, a fourth layer 34, a third insulating layer 43, a fourth insulating layer 44, and conductive layers 51b to 55b. The configurations of the components of the structure body 10-2 are similar to those of one of the digital isolators 100 to 130. For example, as illustrated in FIG. 24, the configuration of the B1-B2 cross section of the structure body 10-2 is similar to the configuration of the II-II cross section of the digital isolator 100 illustrated in FIG. 2.

In other words, as illustrated in FIG. 24, for example, the fourth metal portion 14 is provided inside an insulating portion 20c. The conductive layer 51b is provided between the fourth metal portion 14 and the insulating portion 20c. The second insulating portion 22 is provided on the fourth metal portion 14 and the insulating portion 20c. The fifth metal portion 15 is provided on the second insulating portion 22. For example, the fifth metal portion 15 is provided inside an insulating portion 20d. The conductive layer 52b is provided between the fifth metal portion 15 and the insulating portion 20d.

The fourth metal portion 14 and the fifth metal portion 15 are coils provided in spiral configurations along the X-Y plane. The fourth metal portion 14 and the fifth metal portion 15 oppose each other in the Z-direction. In other words, the fifth metal portion 15 is provided to overlap the fourth metal portion 14 in FIG. 22 when viewed from the Z-direction.

The sixth metal portion 16 surrounds the fourth metal portion 14 and the fifth metal portion 15 in the X-direction and the Y-direction. The sixth metal portion 16 is connected to the reference potential. As illustrated in FIG. 24, the sixth metal portion 16 includes a fourth portion 16d, a fifth portion 16e, and a sixth portion 16f.

The fourth portion 16d is provided around the fourth metal portion 14 in the X-direction and the Y-direction. For example, the fourth portion 16d is provided inside the insulating portion 20c. The conductive layer 53b is provided between the fourth portion 16d and the insulating portion 20c.

The fifth portion 16e is provided on a portion of the fourth portion 16d. The second insulating portion 22 is provided on another portion of the fourth portion 16d. The conductive layer 54b is provided between the fifth portion 16e and the fourth portion 16d and between the fifth portion 16e and the second insulating portion 22.

The sixth portion 16f is provided around the fifth metal portion 15 in the X-direction and the Y-direction. For example, the sixth portion 16f is provided inside the insulating portion 20d. The conductive layer 55b is provided between the sixth portion 16f and the insulating portion 20d.

As illustrated in FIG. 24, the third layer 33 is provided around the bottom portion of the fifth portion 16e. The third layer 33 contacts the conductive layer 54b and the other portion of the fourth portion 16d recited above. Therefore, the second insulating portion 22 does not contact the fourth portion 16d and is separated from the fourth portion 16d in the Z-direction.

The third insulating layer 43 is provided between the fourth metal portion 14 and the second insulating portion 22. The third insulating layer 43 may contact the fourth metal portion 14 or may be separated from the fourth metal portion 14 in the Z-direction.

The fourth layer 34 is provided on the second insulating portion 22. The fourth layer 34 is provided around the bottom portion of the sixth portion 16f and around the bottom portion of the fifth metal portion 15 and contacts the conductive layers 52b and 55b. The fourth insulating layer 44 is provided on the fourth layer 34 and contacts the conductive layers 52b and 55b.

In the digital isolator 160, the third layer 33 is insulative. The third layer 33 is provided also between the fourth metal portion 14 and the third insulating layer 43 and contacts the fourth metal portion 14. The third insulating layer 43 is positioned between the third layer 33 and the second insulating portion 22. The third insulating layer 43 is provided also between the second insulating portion 22 and the other portion of the fourth portion 16d recited above and contacts the conductive layer 54b.

One end of the first metal portion 11 is electrically connected to the first circuit 1 via wiring 60a. The other end of the first metal portion 11 is electrically connected to the first circuit 1 by wiring 61a. An electrode pad 62a is connected to one end of the second metal portion 12.

One end of the fourth metal portion 14 is electrically connected to the second circuit 2 via wiring 60b. The other end of the fourth metal portion 14 is electrically connected to the second circuit 2 by wiring 61b. An electrode pad 62b is connected to one end of the fifth metal portion 15.

The second metal portion 12 is electrically connected to the fifth metal portion 15. Specifically, the electrode pads 62a and 62b are connected respectively to the one end of the second metal portion 12 and the one end of the fifth metal portion 15. The electrode pads 62a and 62b are electrically connected by the bonding wire 63. Electrode pads 65a and 65b are connected respectively to the other end of the second metal portion 12 and the other end of the fifth metal portion 15. The electrode pads 65a and 65b are electrically connected by a bonding wire 66.

Or, the electrode pad 62a of the structure body 10-1 and the electrode pad 65b of the structure body 10-2 may be connected by a bonding wire; and the electrode pad 65b of the structure body 10-1 and the electrode pad 62b of the structure body 10-2 may be connected by a bonding wire. In the digital isolator 160, the first circuit 1 is electrically connected to the first metal portion 11 of the structure body 10-1; and the second circuit 2 is electrically connected to the fourth metal portion 14 of the structure body 10-2.

In the structure body 10-1, one end portion of the first metal portion 11 may be electrically connected to the third metal portion 13. The one end portion of the first metal portion 11 may be connected to the reference potential by wiring, etc., other than the third metal portion 13. In the structure body 10-2, one end portion of the fourth metal portion 14 may be electrically connected to the sixth metal portion 16. The one end portion of the fourth metal portion 14 may be connected to the reference potential by wiring, etc., other than the sixth metal portion 16.

The fourth metal portion 14, the fifth metal portion 15, and the sixth metal portion 16 include metals. From the perspective of reducing the electrical resistances, it is favorable for the fourth metal portion 14 and the fifth metal portion 15 to include copper.

The second insulating portion 22 includes an insulating material such as silicon oxide, etc.

The conductive layers 51b to 55b include tantalum. The conductive layers 51b to 55b may include a nitride of tantalum. The conductive layers 51b to 55b may have a stacked structure of tantalum and a nitride of tantalum.

The third layer 33 and the fourth layer 34 include carbon, silicon, and at least one selected from the group consisting of oxygen and nitrogen. For example, the third layer 33 and the fourth layer 34 include SiCO, SiCN, or SiCON. The material that is included in the fourth layer 34 may be different from the material included in the third layer 33.

The third insulating layer 43 and the fourth insulating layer 44 include silicon nitride.

The carbon concentration in the third layer 33 is higher than the carbon concentration in the third insulating layer 43.

The Young's modulus of the third layer 33 is lower than the Young's modulus of the third insulating layer 43. Similarly, the carbon concentration in the fourth layer 34 is higher than the carbon concentration in the fourth insulating layer 44 and higher than the carbon concentration in the third insulating layer 43. The Young's modulus of the fourth layer 34 is lower than the Young's modulus of the fourth insulating layer 44 and lower than the Young's modulus of the third insulating layer 43. The carbon concentration in the third layer 33 may be the same as or different from the carbon concentration in the fourth layer 34. On the other hand, to improve the insulative properties, it is favorable for the third insulating layer 43 and the fourth insulating layer 44 to be formed without adding carbon.

For example, the carbon concentration in the third layer 33 and the carbon concentration in the fourth layer 34 each are not less than 15 atom % and not more than 25 atom % in atomic composition percent. The carbon concentration in the third insulating layer 43 and the carbon concentration in the fourth insulating layer 44 each are not less than 0 atom % and not more than 10 atom % in atomic composition percent.

By providing the third layer 33 and the fourth layer 34, the peeling of the third insulating layer 43 and the fourth insulating layer 44 can be suppressed; and the reliability of the digital isolator 170 can be increased.

In FIG. 24, the case is described where the configuration of the structure body 10-2 is similar to that of the digital isolator 100. The configuration is not limited to the example; and the configuration of the structure body 10-2 may be similar to that of one of the digital isolators 110 to 130. Or, the configuration of the structure body 10-1 may be similar to that of the digital isolator 140; and the first insulating layer 41 and the second insulating layer 42 may not be provided in the structure body 10-1.

The structure body 10-1 and the structure body 10-2 may be provided on the same substrate or may be configured as one chip. The structure body 10-1 and the structure body 10-2 may be provided on different substrates or may be configured as separate chips. In the case where the structure body 10-1 and the structure body 10-2 are provided on the same substrate, one common layer may be provided as the first layer 31 and the third layer 33. Similarly, one common layer may be provided as the second layer 32 and the fourth layer 34. One common insulating layer may be provided as the first insulating layer 41 and the third insulating layer 43. One common insulating layer may be provided as the second insulating layer 42 and the fourth insulating layer 44. One common insulating portion may be provided as the first insulating portion 21 and the second insulating portion 22.

The second circuit 2 transmits a signal (a current) to the first metal portion 11 of the structure body 10-2. When a current flows in the first metal portion 11 and a magnetic field is generated, a current flows in the second metal portion 12 due to an induced electromotive force. At this time, a current flows also in the fifth metal portion 15 of the structure body 10-1 which is electrically connected to the second metal portion 12. When the current flows in the fifth metal portion 15 and a magnetic field is generated, a current flows in the fourth metal portion 14 due to an induced electromotive force. The first circuit 1 detects the current flowing in the fourth metal portion 14 and generates a signal corresponding to the detection result. Thereby, the signal is transmitted between the first circuit 1 and the second circuit 2 via the pair of structure bodies 10.

Seventh Modification

Figure 25:
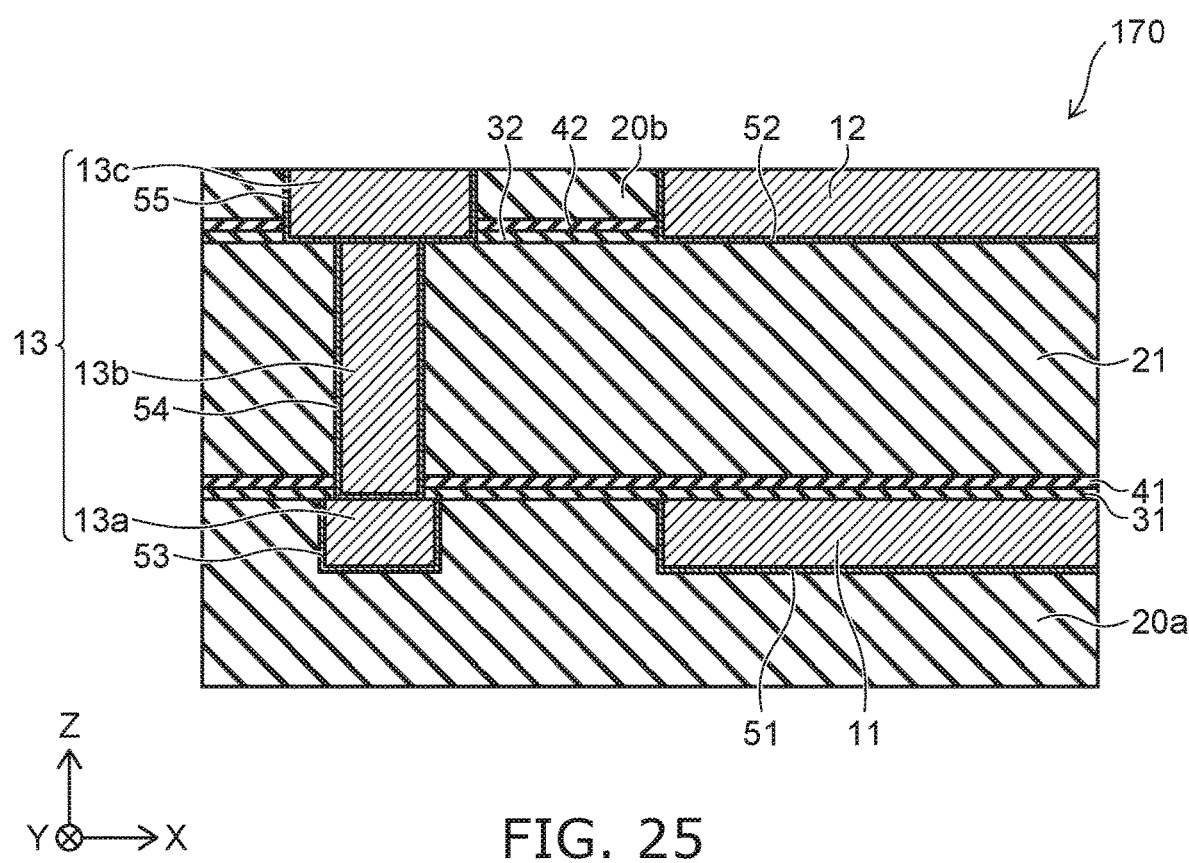
FIG. 25 is a cross-sectional view illustrating a portion of a digital isolator according to a seventh modification of the embodiment.

FIG. 25 is a cross-sectional view illustrating a portion of a digital isolator according to a seventh modification of the embodiment.

In the digital isolator 170 according to the seventh modification as illustrated in FIG. 25, the first metal portion 11 and the second metal portion 12 have flat plate configurations instead of spiral configurations. For example, the first metal portion 11 and the second metal portion 12 are provided so that the upper surface of the first metal portion 11 and the lower surface of the second metal portion 12 are parallel.

Instead of the change of a magnetic field, the digital isolator 170 transmits a signal by utilizing the change of an electric field. Specifically, an electric field is generated between the first metal portion 11 and the second metal portion 12 when the second circuit 2 applies a voltage to the second metal portion 12. A charge that corresponds to the electric field intensity is stored in the first metal portion 11. The first circuit 1 detects the flow of the charge at this time and generates a signal based on the detection result. Thereby, the signal is transmitted in a state in which the current is blocked between the first metal portion 11 and the second metal portion 12.

Other than the structure relating to the first metal portion 11 and the second metal portion 12, the structure of the digital isolator 170 is similar to that of the digital isolator 100. Accordingly, according to the digital isolator 170, similarly to the digital isolator 100, the peeling of the first insulating layer 41 and the second insulating layer 42 due to the stress of the conductive layers 54 and 55 can be suppressed. Also, the electrical resistance between the first metal portion 11 and the second metal portion 12 can be increased; and the leakage current between these metal portions can be reduced.

The structures of the modifications described above can be performed in combination as appropriate. For example, the structures of the first layer 31 and the first insulating layer 41 of one of the digital isolators 100 to 120 may be combined with the structures of the second layer 32 and the second insulating layer 42 of another one of the digital isolators 100 to 120. The first metal portion 11 and the second metal portion 12 may have flat plate configurations in the digital isolators 100, 110, 120, 130, 140, 151, or 152. The first metal portion 11, the second metal portion 12, the fourth metal portion 14, and the fifth metal portion 15 may have flat plate configurations in the digital isolator 160. The structures of the first layer 31, the second layer 32, the first insulating layer 41, and the second insulating layer 42 of the digital isolator 110 or 120 are applicable to those of the digital isolator 170. The first insulating layer 41 and the second insulating layer 42 may not be provided in the digital isolator 170. Or, the gaps G1 and G2 may be provided instead of the first layer 31 and the second layer 32 in the digital isolator 140.

The embodiment may include the following configurations.

(Configuration 1)

A digital isolator, comprising:

a first metal portion;

a first insulating portion provided on the first metal portion;

a second metal portion provided on the first insulating portion;

a third metal portion including a first portion provided around the first metal portion in a direction perpendicular to a first direction, the first direction being from the first metal portion toward the second metal portion, a second portion provided on a portion of the first portion with a first conductive layer interposed, the first conductive layer including tantalum, and a third portion provided on the second portion and provided around the second metal portion in the perpendicular direction; and a first insulating layer contacting an other portion of the first portion and being provided around a bottom portion of the second portion, a gap being provided between the first conductive layer and the first insulating layer.

(Configuration 2)

The isolator according to configuration 1, wherein the first insulating layer is provided also between the first metal portion and the first insulating portion.

(Configuration 3)

The isolator according to configuration 1, further comprising a second insulating layer provided around a bottom portion of the third portion, the third portion being provided on the second portion with a second conductive layer interposed, the second conductive layer including tantalum, the second insulating layer and the second conductive layer having a gap provided between the second insulating layer and the first conductive layer. In the embodiments described above, for example, the elements that are included in each component and the concentrations of the elements can be measured by SIMS (secondary ion mass spectrometry), energy dispersive X-ray spectrometry (EDX), etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A digital isolator, comprising:
a first metal portion;
a first insulating portion provided on the first metal portion;
a second metal portion provided on the first insulating portion;
a third metal portion including
a first portion provided around the first metal portion in a direction perpendicular to a first direction, the first direction being from the first metal portion toward the second metal portion;
a second portion provided on a portion of the first portion with a first conductive layer interposed, the first conductive layer including tantalum;
a third portion provided on the second portion and provided around the second metal portion in the perpendicular direction; and
a first layer contacting the first conductive layer and an other portion of the first portion and being provided around a bottom portion of the second portion,
the first layer including titanium or including silicon and carbon.

2. The isolator according to claim 1, further comprising a first insulating layer provided between the first metal portion and the first insulating portion.

3. The isolator according to claim 2, wherein
the first insulating layer contacts the first conductive layer and is provided also between the first insulating portion and the other portion of the first portion, and
at least a portion of the first insulating layer is positioned between the first layer and the first insulating portion.

4. The isolator according to claim 2, wherein
the first layer is insulative, and
the first layer is provided also between the first metal portion and the first insulating layer.

5. The isolator according to claim 1, wherein
the first layer includes carbon, silicon, and at least one selected from the group consisting of oxygen and nitrogen,
the first insulating layer includes nitrogen and silicon, and
a carbon concentration in the first layer is higher than a carbon concentration in the first insulating layer.

6. The isolator according to claim 2, wherein the first insulating layer is not provided between the first layer and the first insulating portion.

7. The isolator according to claim 1, wherein the first layer is not provided between the first metal portion and the first insulating portion.

8. The isolator according to claim 7, wherein the first layer is conductive or semiconductive.

9. The isolator according to claim 1, further comprising a second layer provided around a bottom portion of the third portion,
the third portion being provided on the second portion with a second conductive layer interposed, the second conductive layer including tantalum,
the second layer contacting the second conductive layer,
the second layer including titanium or including silicon and carbon.

10. The isolator according to claim 1, further comprising:
a second layer provided around a bottom portion of the third portion; and
a second insulating layer provided on the second layer,
the third portion being provided on the second portion with a second conductive layer interposed, the second conductive layer including tantalum,
the second layer contacting the second conductive layer,
a Young's modulus of the second layer being lower than a Young's modulus of the second insulating layer.

11. The isolator according to claim 1, wherein the first metal portion and the second metal portion are provided in spiral configurations along a plane perpendicular to the first direction.

12. The isolator according to claim 11, wherein one end of the first metal portion is electrically connected to the first portion, or one end of the second metal portion is electrically connected to the third portion.

13. The isolator according to claim 1, wherein the first metal portion and the second metal portion are provided in flat plate configurations along a plane perpendicular to the first direction.

14. The isolator according to claim 1, further comprising:
a first circuit electrically connected to the first metal portion; and
a second circuit electrically connected to the second metal portion.

15. A digital isolator, comprising:
a first metal portion;
a first insulating portion provided on the first metal portion;
a second metal portion provided on the first insulating portion;
a third metal portion including
a first portion provided around the first metal portion in a direction perpendicular to a first direction, the first direction being from the first metal portion toward the second metal portion,
a second portion provided on a portion of the first portion with a first conductive layer interposed, the first conductive layer including tantalum, and
a third portion provided on the second portion and provided around the second metal portion in the perpendicular direction;
a first layer contacting the first conductive layer and an other portion of the first portion and being provided around a bottom portion of the second portion; and
a first insulating layer provided between the first metal portion and the first insulating portion,
a Young's modulus of the first layer being lower than a Young's modulus of the first insulating layer.

16. The isolator according to claim 15, wherein the first layer includes titanium.

17. The isolator according to claim 15, wherein the first layer includes silicon and carbon.

* * * * *